(12) United States Patent
Hu

(10) Patent No.: US 11,830,767 B2
(45) Date of Patent: Nov. 28, 2023

(54) DATA LINES IN THREE-DIMENSIONAL MEMORY DEVICES

(71) Applicant: Micron Technology, Inc., Boise, ID (US)

(72) Inventor: Yi Hu, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 282 days.

(21) Appl. No.: 17/402,929

(22) Filed: Aug. 16, 2021

(65) Prior Publication Data
US 2023/0045948 A1 Feb. 16, 2023

(51) Int. Cl.
| H01L 21/768 | (2006.01) |
| H01L 21/321 | (2006.01) |
| H01L 23/528 | (2006.01) |
| H01L 23/522 | (2006.01) |
| H01L 23/532 | (2006.01) |
| H01L 21/3213 | (2006.01) |
| H10B 41/27 | (2023.01) |
| H10B 43/27 | (2023.01) |

(52) U.S. Cl.
CPC .... *H01L 21/76816* (2013.01); *H01L 21/3212* (2013.01); *H01L 21/32133* (2013.01); *H01L 21/7684* (2013.01); *H01L 21/76877* (2013.01); *H01L 23/528* (2013.01); *H01L 23/5226* (2013.01); *H01L 23/53242* (2013.01); *H10B 41/27* (2023.02); *H10B 43/27* (2023.02)

(58) Field of Classification Search
CPC ........... H01L 21/3212; H01L 21/32133; H01L 21/76816; H01L 21/7684; H01L 21/76877; H01L 21/76885; H01L 23/5226; H01L 23/528; H01L 23/53242; H10B 41/27; H10B 43/27
See application file for complete search history.

(56) References Cited

U.S. PATENT DOCUMENTS

| | | | |
|---|---|---|---|
| 2003/0047808 A1* | 3/2003 | Agarwal ................ | H01L 28/60 257/E21.01 |
| 2008/0061334 A1* | 3/2008 | Jung ................ | H01L 21/76849 257/E29.345 |
| 2016/0020170 A1* | 1/2016 | Ho ..................... | H01L 21/76802 257/774 |
| 2016/0268302 A1* | 9/2016 | Lee ........................ | H10B 43/27 |
| 2018/0323200 A1* | 11/2018 | Tang .................... | H01L 23/528 |
| 2021/0351140 A1* | 11/2021 | Tsai .................. | H01L 21/76831 |

* cited by examiner

*Primary Examiner* — Omar F Mojaddedi
(74) *Attorney, Agent, or Firm* — Schwegman Lundberg & Woessner, P.A.

(57) ABSTRACT

A variety of applications can include apparatus having a memory device with an array of vertical strings of memory cells for the memory device with data lines coupled to the vertical strings, where the data lines have been formed by a metal liner deposition process. In the metal liner deposition, a metal can be formed on a patterned dielectric region. The metal liner deposition process allows for construction of the height of the data lines to be well controlled with selection of a thickness for the dielectric region used in forming the metal liner. Use of a metal liner deposition provides a controlled mechanism to reduce data line capacitance by being able to select liner thickness in forming the data lines. The use of the dielectric region with the metal liner deposition can allow the fabrication of the data lines to avoid pitch double or pitch quad processes.

20 Claims, 16 Drawing Sheets

DATA LINES IN THREE-DIMENSIONAL MEMORY DEVICES

FIELD OF THE DISCLOSURE

Embodiments of the disclosure relate generally to memory systems, and more specifically, to memory devices and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
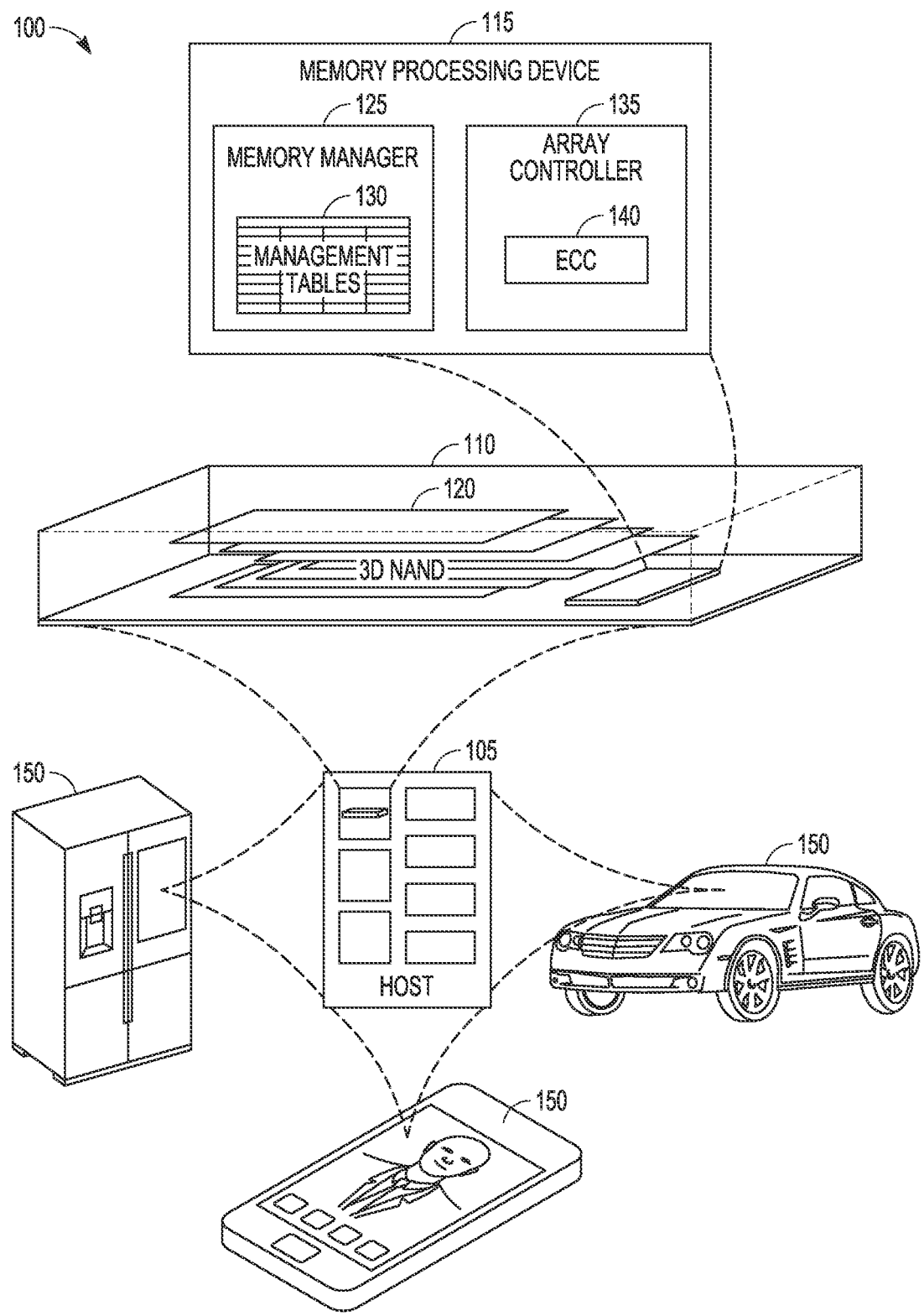
FIG. 1 illustrates an example of an environment including a memory device, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein in its broader context to refer to any memory cell(s) that can store more than one bit of data per cell (i.e., that can represent more than two programmed states). Herein, a memory cell that can store two bits of data per cell (e.g., one of four programmed states) is referred to as a dual-level cell (DLC). A triple-level cell (TLC) refers to a memory cell that can store three bits of data per cell (e.g., one of eight programmed states). A quad-level cell (QLC) can store four bits of data per cell, and a penta-level cell (PLC) can store five bits of data per cell. In a string of memory cells in a 3D memory device such as a 3D NAND memory, access to the string to operate on a memory cell in the string can be controlled by a gating selector device, such as a select gate transistor, which is in series with the memory cells of the string.

In various embodiments, a processing flow can be implemented to reduce data line capacitance through a metal liner deposition. Use of a metal liner deposition in the fabrication of a memory device provides a controlled mechanism to reduce data line capacitance by being able to select liner thickness for forming the data lines. The metal liner deposition can include the formation of dielectric layers for the metal liner. The use of a patterned dielectric layer allows the fabrication flow to avoid pitch double or pitch quad processes. Pitch can be taken to be the distance between repeated elements in a structure. Pitch double and pitch quad processes are multiple patterning techniques to manufacture integrated circuits (ICs) that are directed to enhance feature density in the semiconductor die. A pitch double process, for example, is a process in which the pitch frequency is doubled, that is, the pitch in a pattern is reduced by half. A pitch double process can make use of spacers to extend scanner limitation in resolution. For example, with an immersion processing limitation of approximately 38 nm, a spacer process can be used to define a 19 nm process without deep ultraviolet (DUV) processing.

In addition to avoidance of pitch double and pitch quad processes, a fabrication flow of data lines in a memory device using a metal liner deposition allows for height of the data lines constructed to be well controlled with selection of a thickness for a dielectric for forming a metal liner. For example, different oxide thickness can be used for different heights of the data lines. Selection of the dielectric thickness, such as an oxide thickness, in the fabrication flow can be used to meet criteria for data line capacitance in view of resistance for the data lines. There are multiple options for the selection of metal for the metal liner, and hence for the data lines, to keep resistance within a desired specification. The multiple metal options include, but are not limited to, ruthenium (Ru), tungsten (W), titanium (Ti), other metals, or a permutation of such metals (such as silicides) or combinations thereof.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as IoT devices (e.g., a refrigerator or other appliance, sensor, motor or actuator, mobile communication device, automobile, drone, etc.) to support processing, communications, or control of the product 150.

The memory device 110 includes a memory processing device 115 and a memory array 120 including, for example, a number of individual memory die (e.g., a stack of 3D NAND die). In 3D architecture semiconductor memory technology, vertical structures are stacked, increasing the number of tiers, physical pages, and accordingly, the density of a memory device (e.g., a storage device). Data lines to the vertical structures in the number of individual memory dies can be fabricated using a metal liner deposition in accordance with features of methods disclosed herein. In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, a embedded MMC (eMMC™) interface, or one or more other connectors or interfaces. The host device 105 can include a host system, an electronic device, a processor, a memory card reader, or one or more other electronic devices external to the memory device 110. In some examples, the host device 105 may be a machine having some portion, or all, of the components discussed in reference to the machine 500 of FIG. 5.

The memory processing device 115 can receive instructions from the host device 105, and can communicate with the memory array, such as to transfer data to (e.g., write or erase) or from (e.g., read) one or more of the memory cells, planes, sub-blocks, blocks, or pages of the memory array. The memory processing device 115 can include, among other things, circuitry or firmware, including one or more components or integrated circuits. For example, the memory processing device 115 can include one or more memory control units, circuits, or components configured to control access across the memory array 120 and to provide a translation layer between the host device 105 and the memory device 110. The memory processing device 115 can include one or more input/output (I/O) circuits, lines, or interfaces to transfer data to or from the memory array 120. The memory processing device 115 can include a memory manager 125 and an array controller 135.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more components of the memory device 110 (e.g., various information associated with a memory array or one or more memory cells coupled to the memory processing device 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory processing device 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory processing device 115. The memory operations can be based on, for example, host commands received from the host device 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory processing device 115. The memory processing device 115 can be configured to actively detect and recover from error occurrences (e.g., bit errors, operation errors, etc.) associated with various operations or storage of data, while maintaining integrity of the data transferred between the host device 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18.592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode or in a desired MLC mode (such as TLC. QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a MLC NAND flash device may have a higher bit error rate than a corresponding SLC NAND flash device. As such, the MLC device may require more metadata bytes for error data than the corresponding SLC device.

Figure 2:
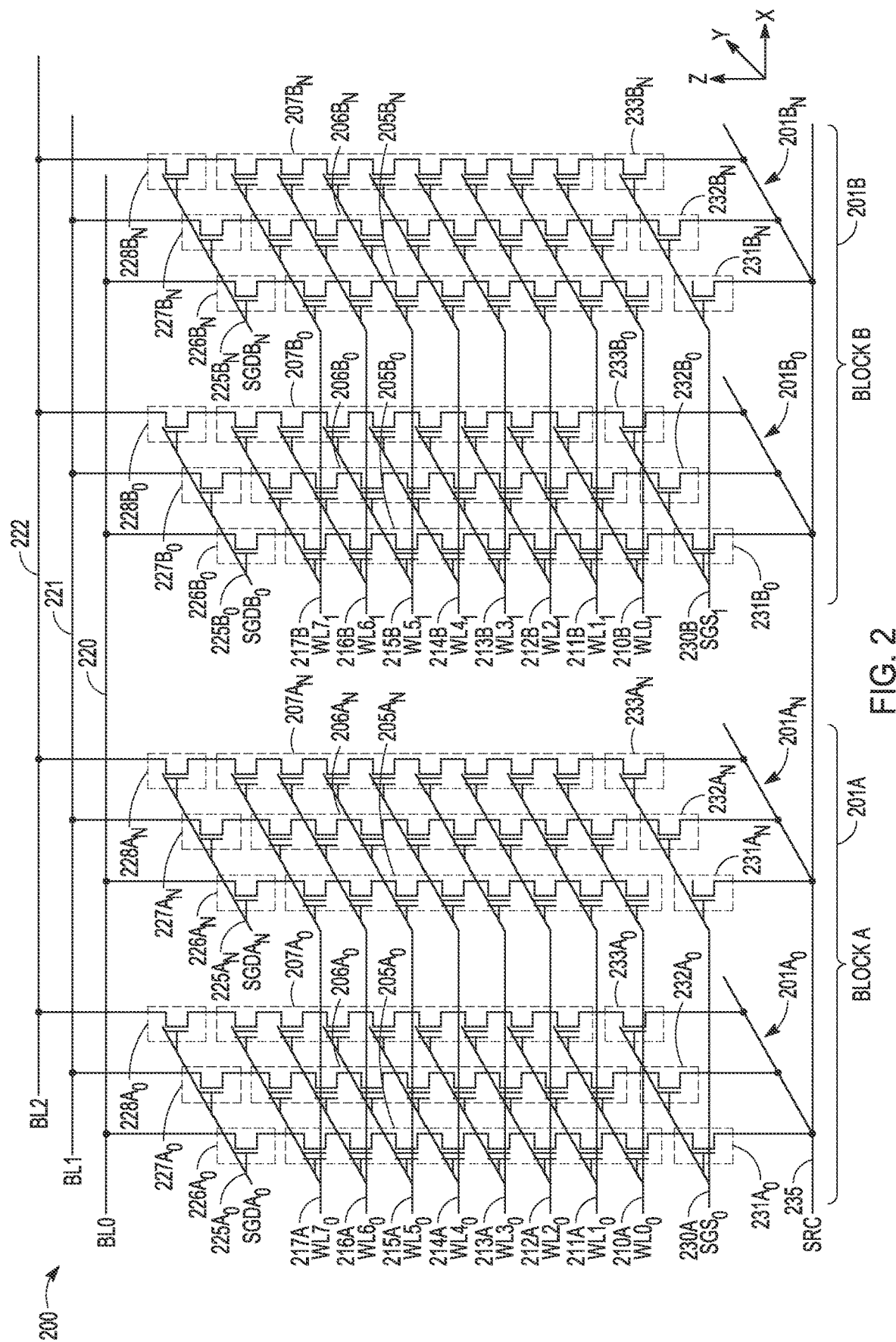
FIGS. 2 and 3 illustrate schematic diagrams of an example of a three-dimensional NAND architecture semiconductor memory array, according to various embodiments.

FIG. 2 illustrates an example schematic diagram of a 3D NAND architecture semiconductor memory array 200 that can be implemented as memory array 120 of FIG. 1. The 3D NAND architecture semiconductor memory array 200 can include a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201 $A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS 231 $A_0$-233$A_0$, first-third $A_n$ SGS 231$A_n$-233$A_n$, first-third $B_0$ SGS 231$B_0$-233$B_0$, first-third $B_n$ SGS 231$B_n$-233$B_n$, etc.) and a drain-side select gate (SGD) (e.g., first-third $A_0$ SGD 226$A_0$-228$A_0$, first-third $A_n$ SGD 226$A_0$-228$A_n$, first-third $B_0$ SGD 226$B_0$-228$B_0$, first-third $B_n$ SGD 226$B_n$-228$B_n$, etc.). Each string of memory cells in the 3D memory array can be arranged along the X direction as data lines (e.g., bit lines (BL) BL0-BL2 220-222) and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, with each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the CGs of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
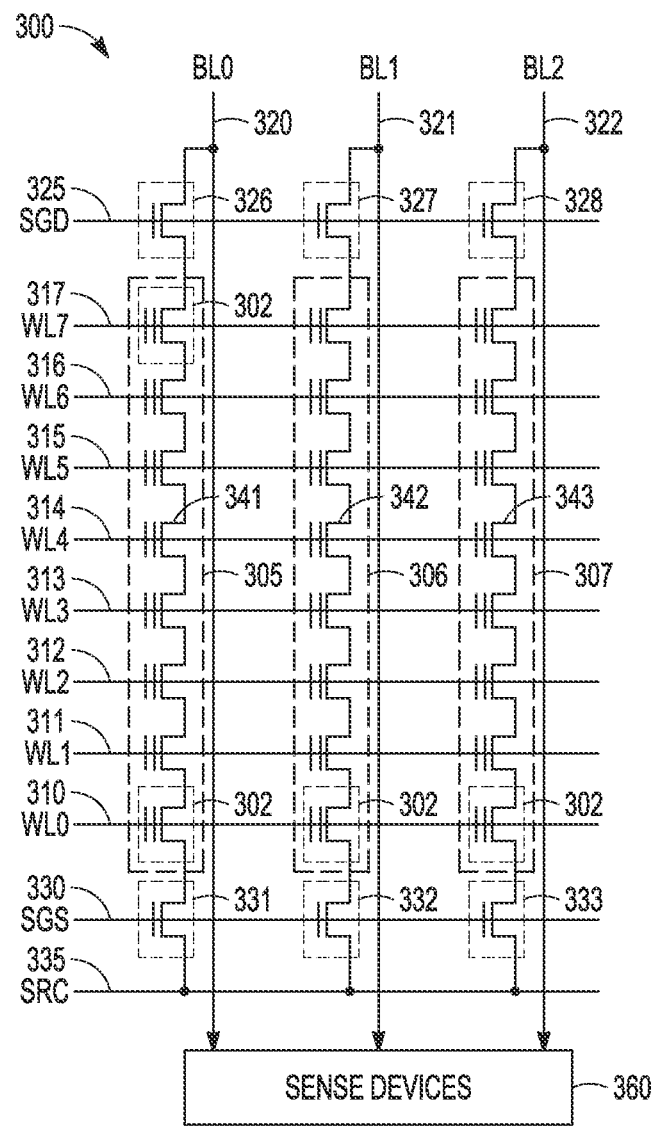

FIG. 3 illustrates an example schematic diagram of a portion of a NAND architecture semiconductor memory array 300 that can be implemented as memory array 120 of FIG. 1. The portion of the NAND architecture semiconductor memory array 300 can include a plurality of memory cells 302 arranged in a two-dimensional (2D) array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third CGs 341-343 of the memory cells coupled to WL4). Programming pulses can begin, for example, at or near 15V. and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an alternating current (AC)-to-direct current (DC) converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2)

320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or FN tunneling, etc.) from the floating gates of the targeted memory cells to the channels.

FIGS. 4-11 illustrate features of an embodiment of an example method of forming data lines of a memory device. The method can be implemented in forming the data lines 220-222 of FIG. 2, the data lines 320-322 of FIG. 3 in the memory array 120 of the memory device 110 of FIG. 1, or data lines, or other conductive structures, in these or other types of memory devices.

Figure 4:
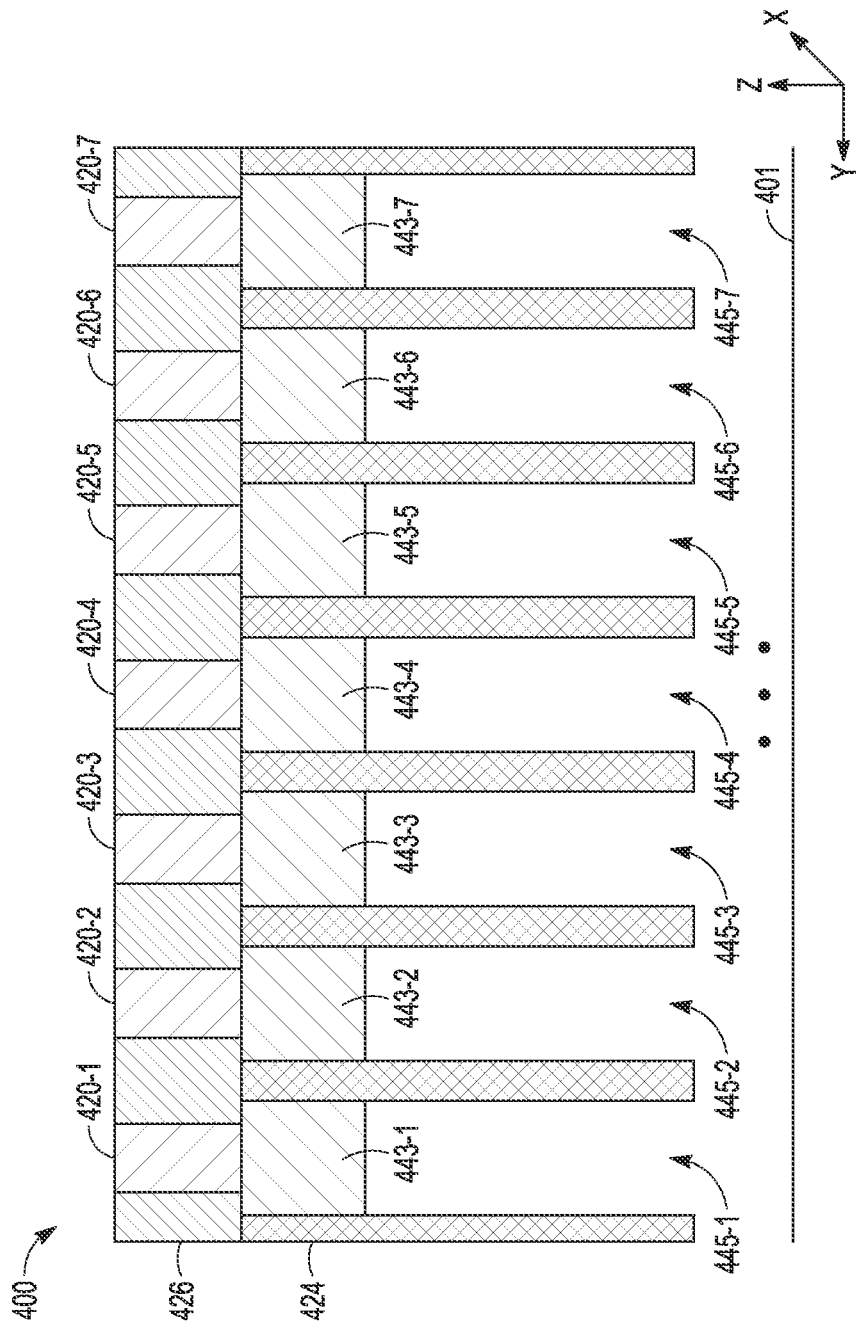
FIGS. 4-11 illustrate features of an example method of forming data lines of a memory device, according to various embodiments.

FIG. 4 shows a cross-sectional view of structure 400 after forming pillars 445-1, 445-2, 445-3, 445-4, 445-5, 445-6, and 445-7 of semiconductor material containing memory cells of the memory device being formed. Each pillar provides a string of memory cells in a memory array above a substrate 401 of the memory device. One or more gate select devices can be included in each pillar, at the top of the pillar, to operationally select a respective string for a memory operation in an implementation of the completed memory device. The bottom of the pillars 445-1, 445-2, 445-3, 445-4, 445-5, 445-6, and 445-7 are not shown, for ease of discussion, and can include one or more gate select devices in each pillar at the bottom of the pillar. The cross-sectional view is shown in a direction to discuss formation of data lines to the strings of memory cells. For reference purposes, the direction in the cross-sectional view FIG. 4 is along the y-axis that is perpendicular to the view along the x-axis of FIG. 2.

Conductive plugs 443-1, 443-2, 443-3, 443-4, 443-5, 443-6, and 443-7 have been formed coupled to pillars 445-1, 445-2, 445-3, 445-4, 445-5, 445-6, and 445-7, respectively. The conductive plugs can include conductive semiconductor material. The conductive semiconductor material can be, but is not limited to, conductive polysilicon. Contacts 420-1, 420-2, 420-3, 420-4, 420-5, 420-6, and 420-7 have been formed coupled to conductive plugs 443-1, 443-2, 443-3, 443-4, 443-5, 443-6, and 443-7, respectively. The contacts can include one or more metals. The one or more metals can include, but are not limited to, tungsten. The pillars 445-1 . . . 445-7 and the conductive plugs 443-1 . . . 443-7 have been formed such that the pillars and the conductive plugs are disposed in a dielectric region 424. Alternatively, the conductive plugs 443-1 . . . 443-7 can be disposed in a dielectric region that is different from the dielectric region in which the pillars 445-1 . . . 445-7 have been disposed. Contacts 420-1, 420-2, 420-3, 420-4, 420-5, 420-6, and 420-7 have been disposed in a dielectric region 426. Material of the dielectric region 426 can be the same as the material for the dielectric region 424. The material of one or both of the dielectric regions 426 and 424 can be, but is not limited to, an oxide. The oxide can be, but is not limited to, silicon oxide. One or both of the dielectric regions 426 and 424 can be an electrically insulating nitride such as, but not limited to, silicon nitride. In FIG. 4, various components for the memory device being fabricated are shown as being seven in number, for ease of presentation. Though the components are shown as seven in number, a memory device can include thousands or more of such components.

There are a number of different techniques to forming the structure 400 shown in FIG. 4. For example, the formation of memory cells in the pillars 445-1 . . . 445-7 can include a replacement gate process for forming a control gate for each of the memory cells. A replacement gate process can include forming gates in a process in which an initially formed region, having material such as silicon nitride, is removed and replaced by conductive material forming a gate in each of a number of memory cells in a vertical string in a pillar. The replacement gates may be coupled to access lines, for example word lines, or may be formed as part of the access lines. Other techniques can be used to form the structure 400 using conventional fabrication processes such as, but not limited to, chemical vapor deposition (CVD), atomic layer deposition (ALD), wet etching, dry etching, selective etching, chemical mechanical planarization (CMP), or other semiconductor fabrication procedure associated with forming a memory device. The material and fabrication processes can be selected to meet the architecture of the memory device being formed. Once formed, the structure 400 becomes a basis of which to form data lines for the memory device being formed. For the procedures discussed herein, the selection of processing materials can depend on the materials selected to form various components of and contacts to devices of the memory array of the memory device being constructed. The processing materials can be selected to allow removal of one or more materials, while retaining one or more other materials. In addition, deposition techniques can be used that are typical for the material being formed, the dimensions of the material being formed, and the architecture in which the material is being formed.

Figure 5:
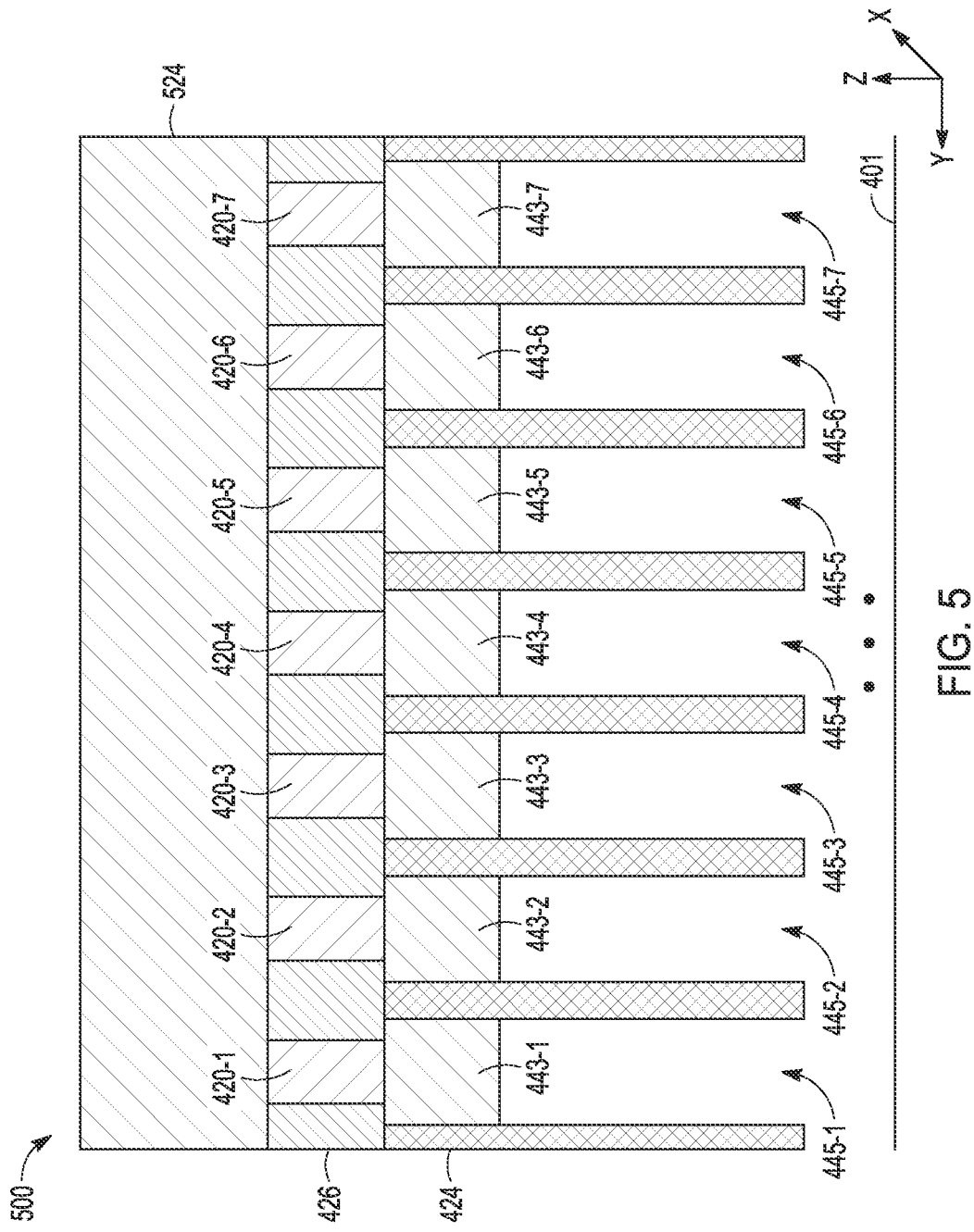

FIG. 5 shows a cross-sectional view of a structure 500 resulting from a dielectric material 524 having been formed on the structure 400 of FIG. 4. The formation of the dielectric material 524 can use appropriate deposition processes for the materials used. Appropriate deposition techniques can include, for example, CVD, ALD, variations of CVD and ALD, or other techniques. The selection of the dielectric material 524 can include material that can be processed according to a selected pattern to be used in procedures for forming data lines. The dielectric material 524 can be, but is not limited to, an oxide. The oxide can be, but is not limited to, silicon oxide. Other dielectric material can be used. For example, the dielectric material 524 can be an electrically insulating nitride such as, but not limited to, silicon nitride.

Figure 6:
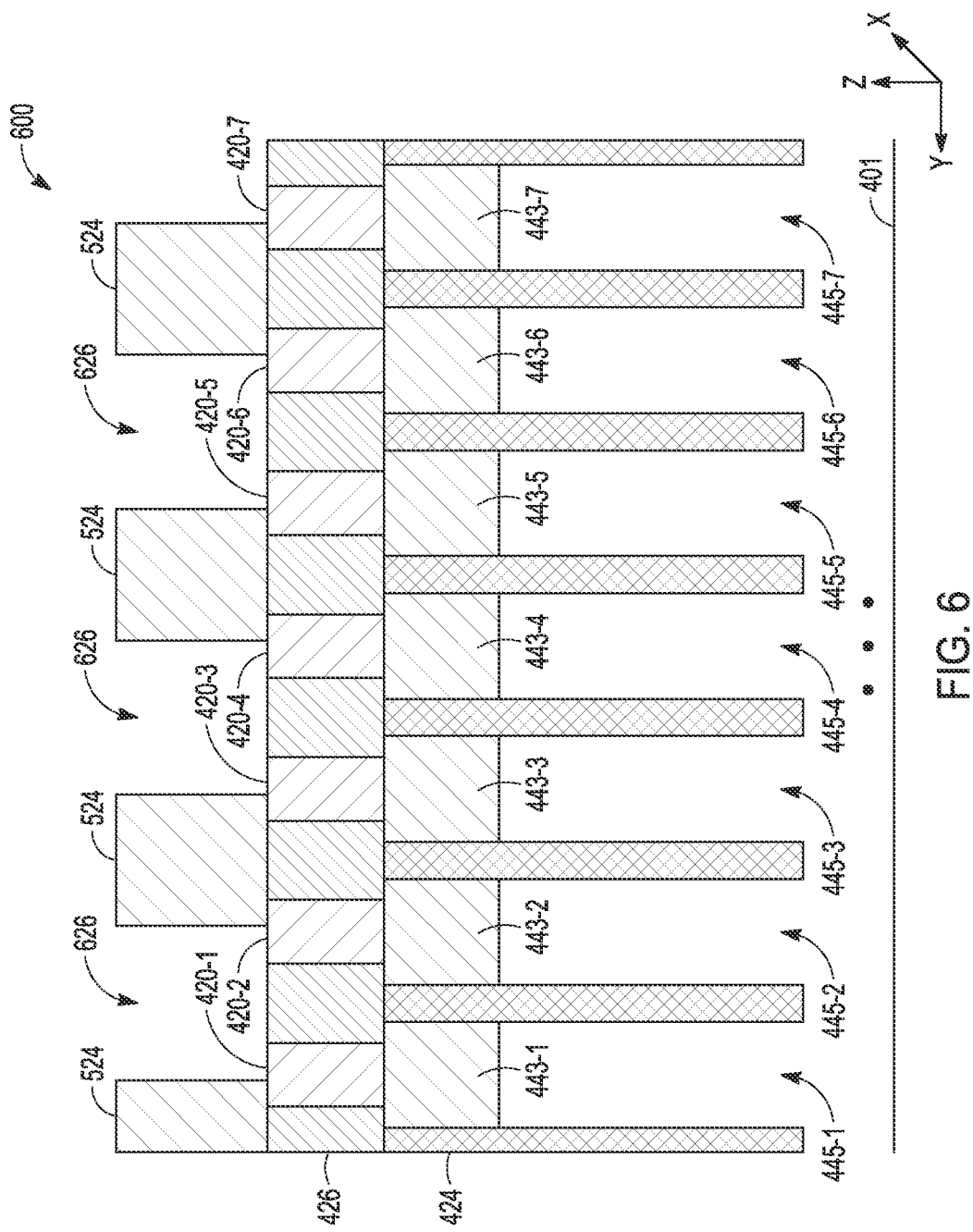

FIG. 6 shows a cross-sectional view of a structure 600 resulting from the structure 500 of FIG. 5 having undergone further processing. A pattern of lines has been made with selected portions of the dielectric material 524 removed, leaving openings 626 in the dielectric material 524. The openings 626 define lines having large widths relative to the widths of data lines to be formed using the openings 626. With the pitch of these lines formed by the openings 626, formation of data lines can be performed without using a pitch double or pitch quad process. The pitch of the lines formed by the openings 626 can be selected based on the desired pitch of the data lines to be formed. The openings 626 can be formed such that walls of the openings 626 substantially contact centers of each of the contacts 420-1 and 420-2 in a first one of the openings 626, each of the contacts 420-3 and 420-4 in a second one of the openings 626, each of the contacts 420-5 and 420-6 in a third one of the openings 626, and each of contact 420-7 and another contact in a fourth one of the openings 626.

Figure 7:
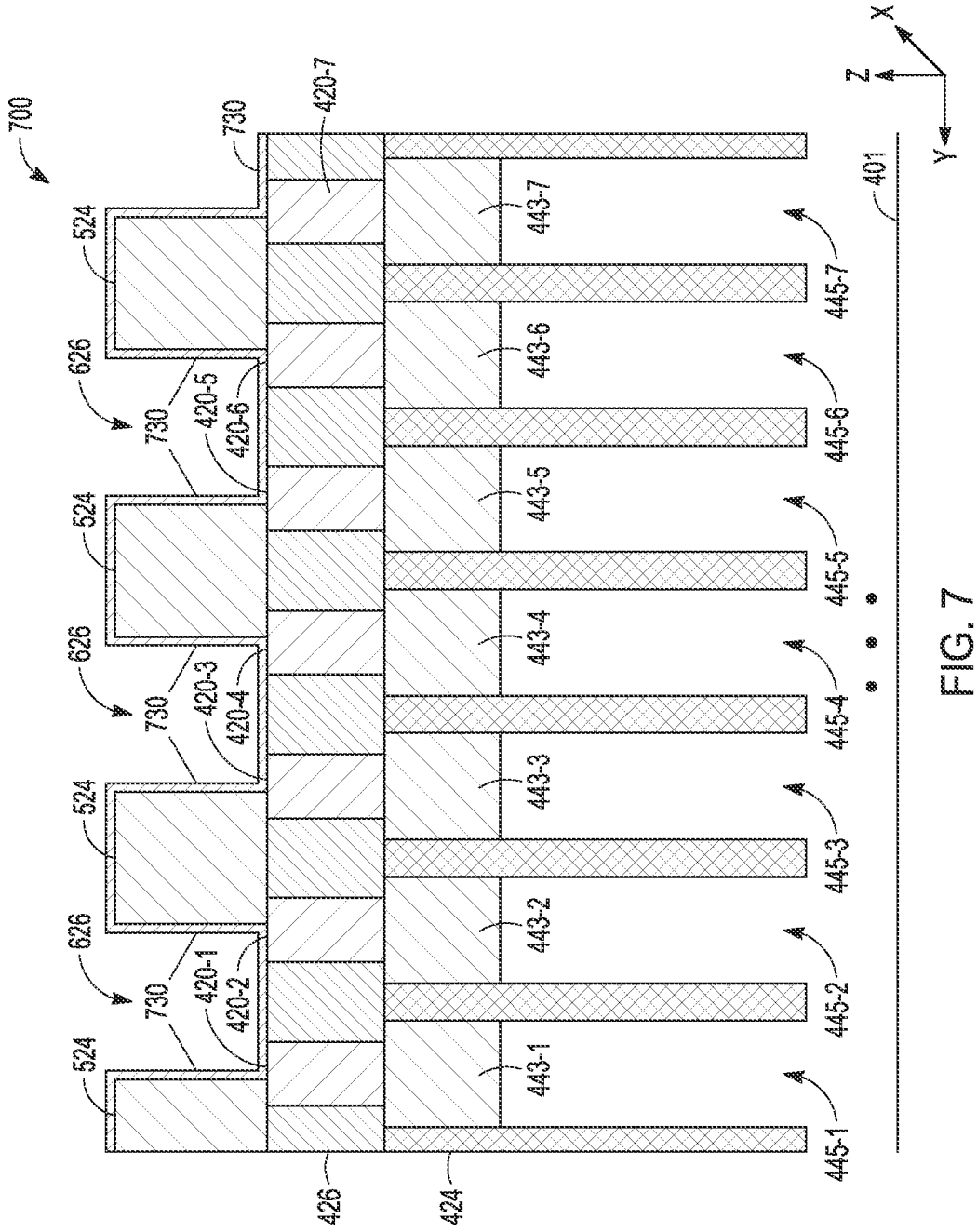

FIG. 7 shows a cross-sectional view of a structure 700 resulting from the structure 600 of FIG. 6 having been further processed by forming a metal liner 730 on the surface of the structure 600 of FIG. 6. The formation of the metal liner 730 includes forming the metal liner 730 on the walls defining the openings 626. A liner is material designed to line the inside of a larger region. A metal liner is a liner having metal material. The metal liner 730 contacts at least a portion of contact 420-1 and a portion of contact 420-2 in a first one of the openings 626. The metal liner 730 contacts at least a portion of contact 420-3 and a portion of contact 420-4 in a second one of the openings 626. The metal liner 730 contacts at least a portion of contact 420-5 and a portion of contact 420-6 in a third one of the openings 626. The metal liner 730 contacts at least a portion of contact 420-7 and a portion of another contact (not shown) in a fourth one of the openings 626. The metal liner 730 can be formed, based on the walls of the openings 626, substantially on centers of the contacts 420-1, 420-2, 420-3, 420-4, 420-5, 420-6, and 420-7.

Formation of the metal liner 730 includes the metal liner 730 being formed in the openings 626, where each opening 626 has been formed along a direction in which data lines are to run in the memory device. The vertical surfaces of the ends of each opening 626 that are perpendicular to the direction in which the data lines run are also covered with the material of the metal liner 730, though not shown in this cross-sectional view. With the cross-section shown in FIG. 7 being in the y-direction, the openings 626 can run along the x-direction, with the ends (not shown in FIG. 7) along the y-direction.

The deposition process for the metal liner 730 can be chosen based one or more desired characteristics for the data lines being formed using the metal liner 730. For a thin metal liner, the metal liner can be deposited using an ALD process, which can allow control of the thickness of the metal liner. The metal liner 730 formed in the openings 626 can include metal selected to meet one or more criteria to function as data lines to the memory array of memory cells. The metal or metals selected for the metal liner 730 can be selected such that thickness of the metal liner can be controlled in forming the metal liner to meet resistance and capacitance criteria. The metal liner can include, but is not limited to, tungsten, ruthenium, titanium, titanium nitride, other metals, a combination of metals, or a permutation of combinations of metals. For a thin metal liner, ruthenium can be used, since ruthenium has a low resistance compared to tungsten, for example. The selection of a lower resistance metal can be performed to take into consideration a small critical dimension (CD) in the design of the structure of the memory device being fabricated. Typically, CD refers to a dimension of a part in component of a specification for which an indicated tolerance is expected to be met.

Figure 8:
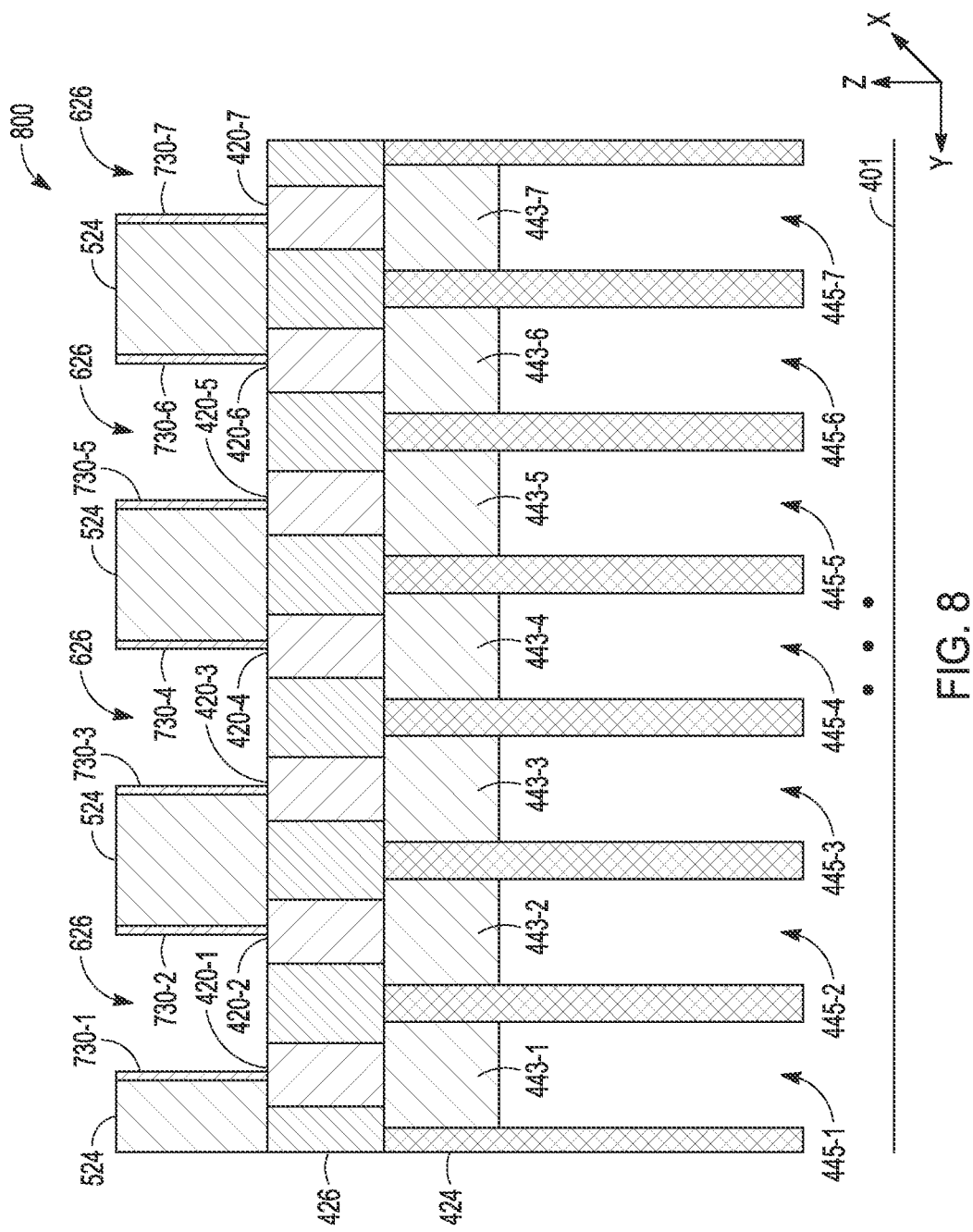

FIG. 8 shows a cross-sectional view of a structure 800 resulting from the structure 700 of FIG. 7 having been further processed. Portions of the metal liner 730 has been removed in each opening 626, while keeping vertical portions of the metal liner 730 that were formed on the walls of each opening 626. As a result of the removal, a vertical metal liner portion 730-1 and a vertical metal liner portion 730-2 are disposed in one of the openings 626, with vertical metal end liner portions connecting the vertical metal liner portions 730-1 and 730-2 (see FIG. 11 regarding the vertical metal end liners). A vertical metal liner portion 730-3 and a vertical metal liner portion 730-4 are disposed in a second one of the openings 626, with vertical metal end liner portions connecting the vertical metal liner portions 730-3 and 730-4 (see FIG. 11 regarding the vertical metal end liner portions). A vertical metal liner portion 730-5 and a vertical metal liner portion 730-6 are disposed in a third one of the openings 626, with vertical metal end liner portions connecting the vertical metal liner portions 730-5 and 730-6 (see FIG. 11 regarding the vertical metal end liner portions). A vertical metal liner portion 730-7 and a vertical metal liner portion (not shown) forming a pair of vertical metal liners are disposed in a fourth one of the openings 626 connecting the vertical metal liner portions with vertical metal end liner portions connecting the vertical metal liner portion 730-7 and its associated vertical metal liner portion in the same opening 626 (see FIG. 11 regarding the vertical metal end liners).

The formation of the openings 626, the metal liner 730 deposition, and selective removal of portions of the metal liner 730 formed vertical metal liner portions on a pair-wise basis with portions of the vertical metal liner portions in the same opening coupled to different contacts and the region between the vertical metal liner portions in the same opening remaining open. Adjacent vertical metal liner portions that are in different openings 626 are separated by the dielectric material 524 used to form the openings 626.

Figure 9:
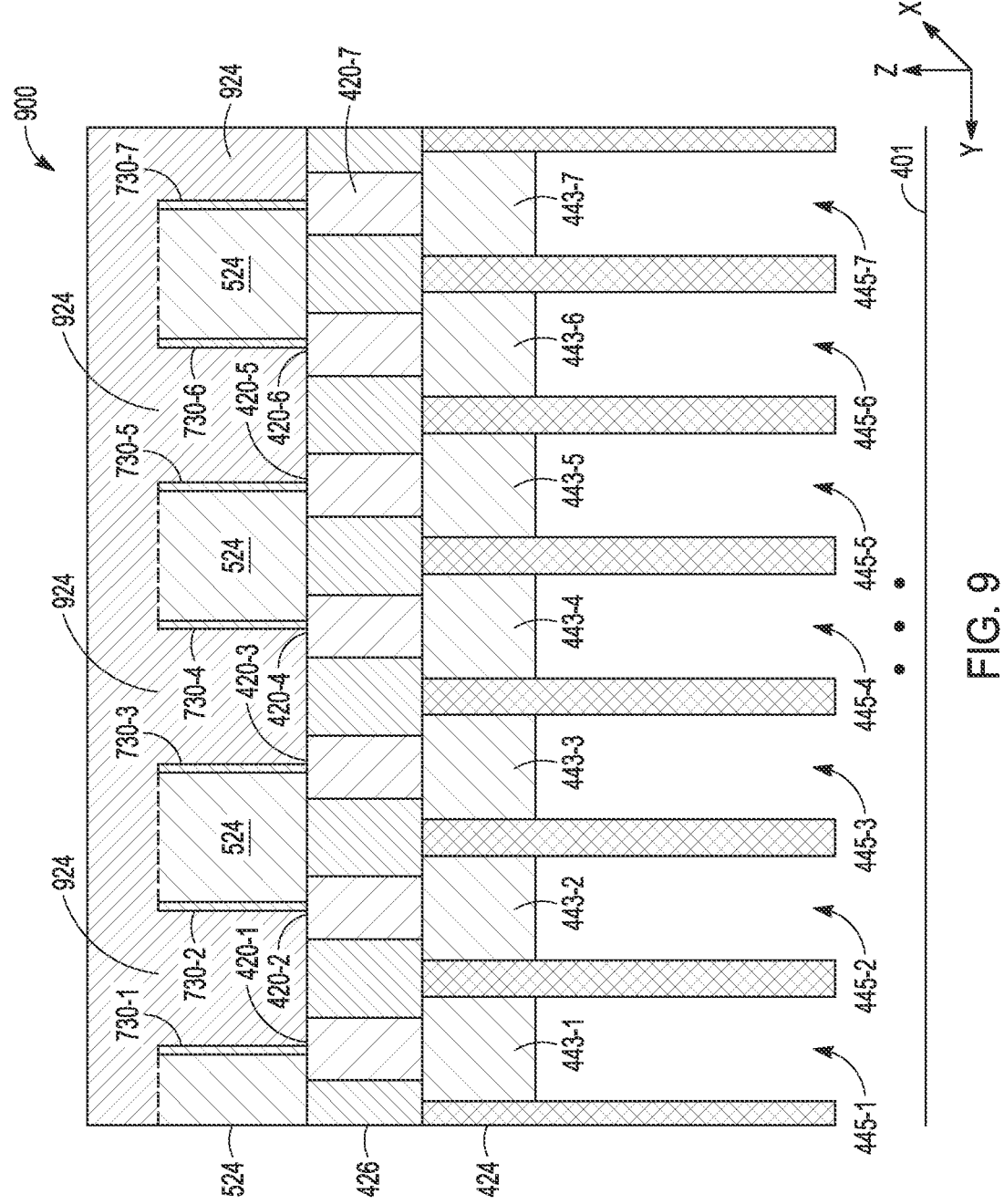

FIG. 9 shows a cross-sectional view of a structure 900 resulting from the structure 800 of FIG. 8 having been further processed. Dielectric material 924 has been formed over the exposed surfaces of the structure 800, filling the opening 626 and providing a layer of the dielectric material 924 on and to a level above the vertical metal liner portions 730-1 . . . 730-7. The formation of the dielectric material 924 can use appropriate deposition processes for the materials used. The dielectric material 924 can be of the same type of material as the material of the dielectric material 524. With the dielectric material 924 being the same type of material as the material of the dielectric material 524, the combination of the dielectric material 924 and the dielectric material 524 can be taken to be an effective single dielectric material 924. The dielectric material 924 can be, but is not limited to, an oxide. The oxide can be, but is not limited to, silicon oxide. Other dielectric material can be used. For example, the dielectric material 924 can be an electrically insulating nitride such as, but not limited to, silicon nitride.

Figure 10:
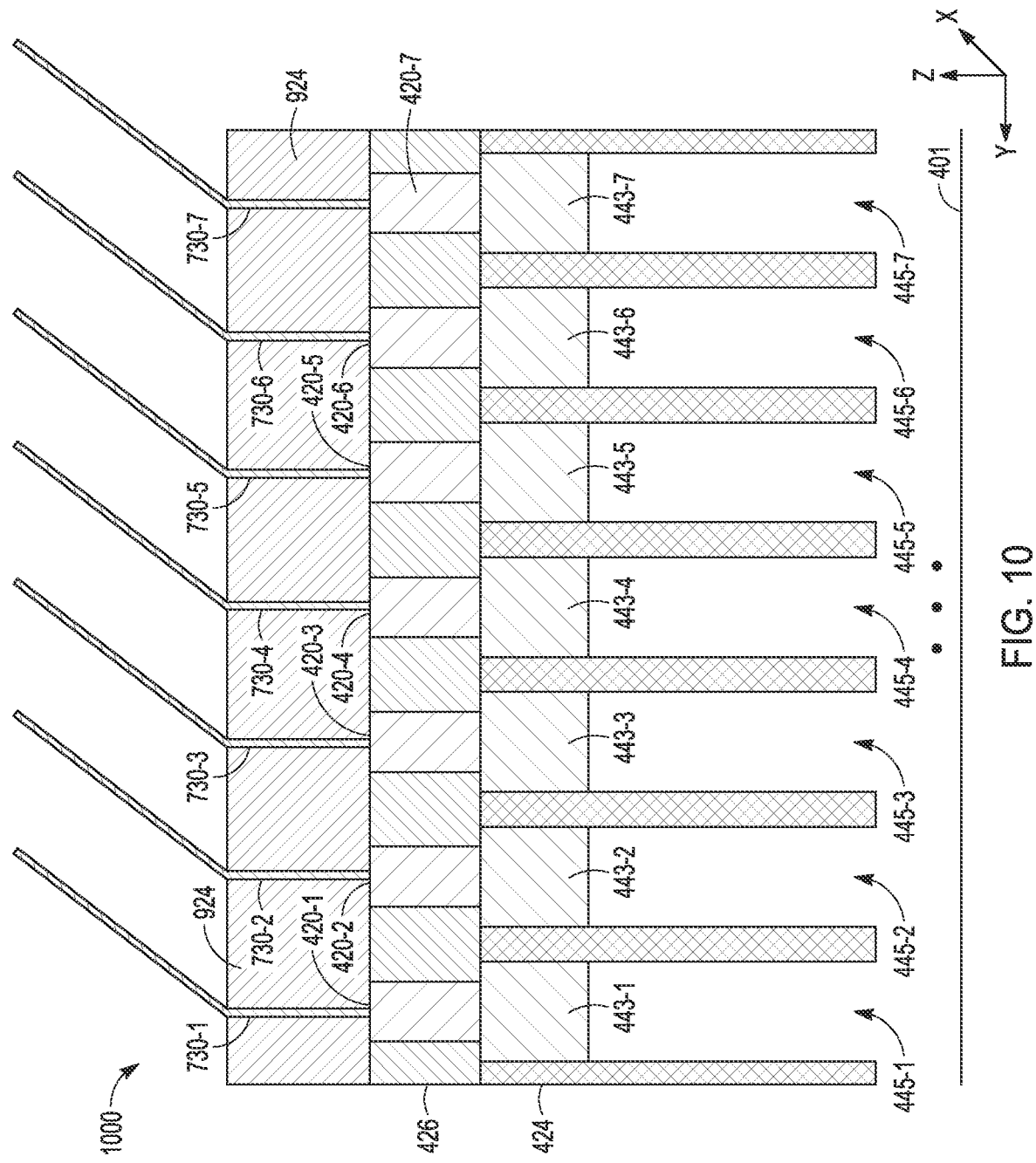

FIG. 10 shows a cross-sectional view of a structure 1000 resulting from the structure 900 of FIG. 9 having been further processed. The top portion of the structure 800 has been subjected to a CMP procedure. The CMP procedure can be used to not only expose the tops of the vertical metal liner portions 730-1 . . . 730-7, but also reduce the vertical metal liner portions 730-1 . . . 730-7 to a desired height for data lines of the memory device. The vertical metal liner portions 730-1 . . . 730-7 after the CMP procedure are used as the data lines 730-1 . . . 730-7 for the memory device being formed. FIG. 10 also illustrates that the vertical metal liner portions 730-1 ... 730-7 providing the data lines for the memory device run along a selected direction by the formation of the patterned openings in FIG. 6.

Figure 11:
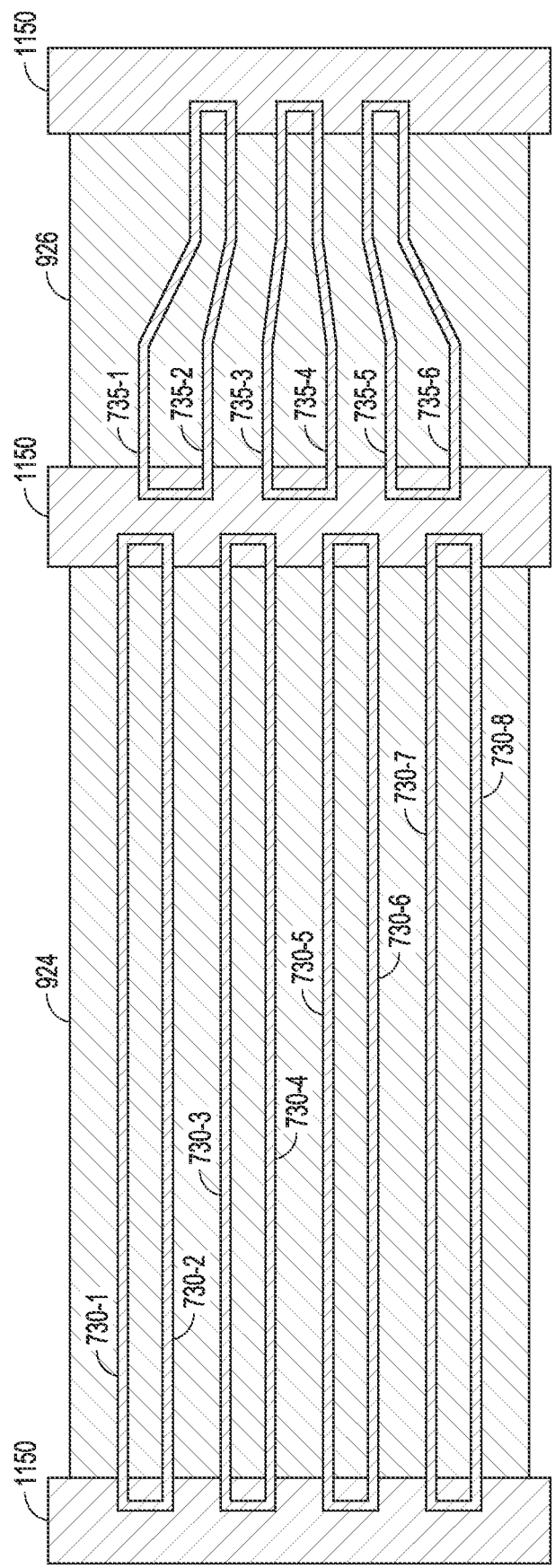

FIG. 11 shows a top view of the structure 1000 along with routing lines 735-1, 735-2, 735-3, 735-4, 735-5, and 735-6 for the data lines 730-1 ... 730-7, where the routing lines 735-1, 735-2, 735-3, 735-4, 735-5, and 735-6 are separated by a dielectric material 926. The routing lines 735-1, 735-2, 735-3, 735-4, 735-5, and 735-6 can be formed in the same manner as forming the data lines 730-1 ... 730-7, with a larger pitch for the routing lines. The routing lines 735-1, 735-2, 735-3, 735-4, 735-5, and 735-6 can be formed on a pair-wise basis. The routing lines 735-1 and 735-2 be formed in a first opening of a pattern for the routing lines. The routing lines 735-3 and 735-4 be formed in a second opening of a pattern for the routing lines. The routing lines 735-5 and 735-6 be formed in a third opening of a pattern for the routing lines. After formation of the data lines 730-1 ... 730-7 and the routing lines 735-1 ... 735-6, a chop mask 1150 can be used to disconnect the ends of the liner or liners formed. Disconnecting the ends removes the pair-wise relationship of the data lines 730-1 ... 730-7 and pair-wise relationship of the routing lines 735-1 ... 735-6, which provides independent data lines and independent routing lines.

Using a single mask for chop mask 1150 having a portion for forming the data lines and a portion for forming the routing lines, the routing lines 735-1 ... 735-6 and the data lines 730-1 ... 730-7 can be formed at the same time, with the dielectric material 926 being formed as part of the dielectric material 924. The single mask can be provided such that the data lines 730-1 ... 730-7 have a smaller pitch than the routing lines 735-1 ... 735-6. For example, the data lines 730-1 ... 730-7 can have a pitch of about 19 nm, while the routing lines 735-1 ... 735-6 have a pitch of about 38 nm, about 46 nm, or other size significantly larger than the pitch of the data lines. Though FIGS. 4-11 are provided as an example method of forming data lines of a memory device, the method is not limited to the eight data lines and six routing lines shown in FIG. 11, after application of the chop mask. The number of data lines and six routing lines can range from a small number to thousands or more.

Figure 12:
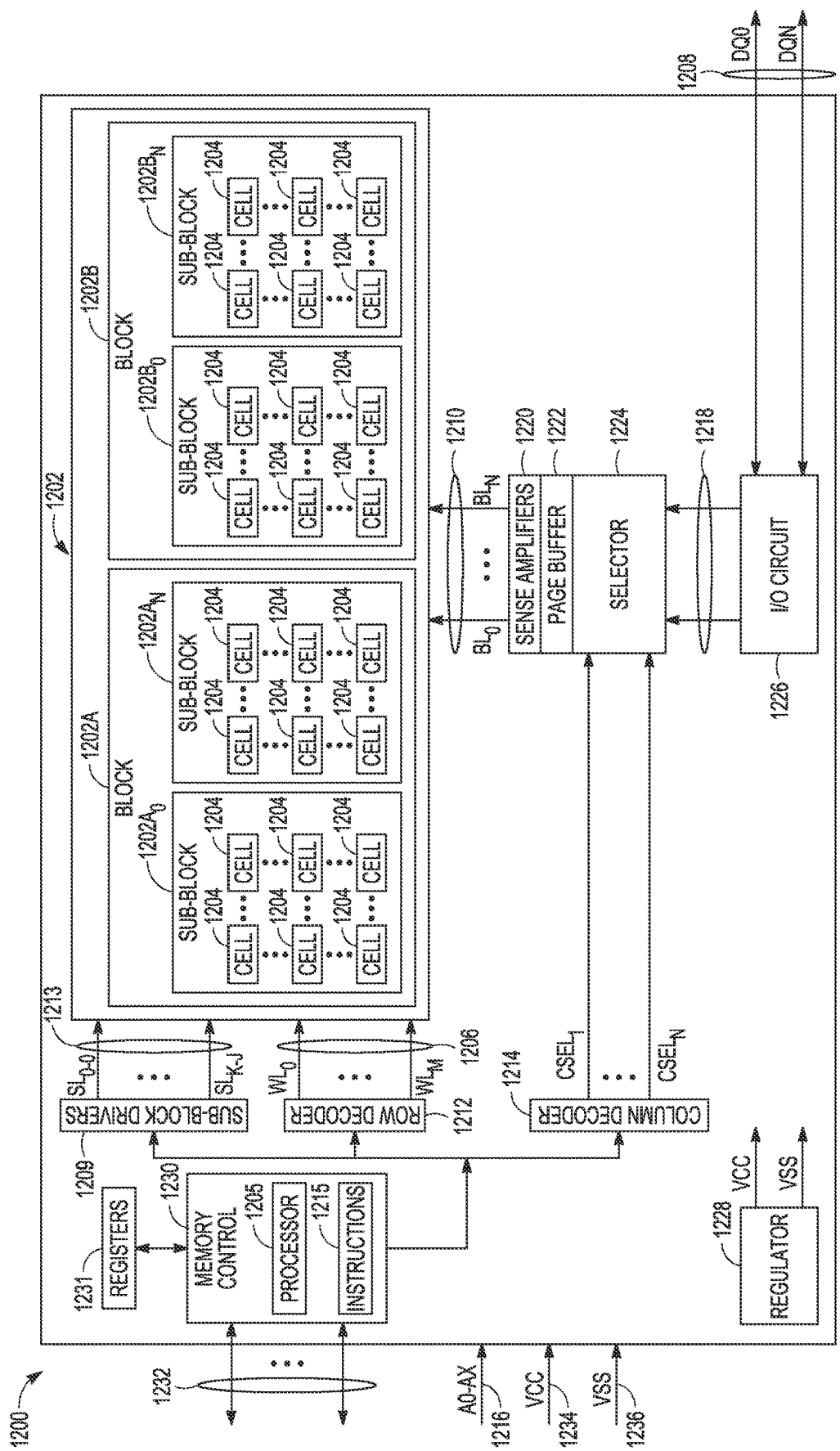
FIG. 12 illustrates a functional block diagram of an example memory device including a memory array having a plurality of memory cells, and one or more circuits or components to provide communication with, or perform one or more memory operations on, the memory array, according to various embodiments.

FIG. 12 illustrates an example block diagram of a memory device 1200, which can be implemented in memory device 110 of FIG. 1, including a memory array 1202 having a plurality of memory cells 1204, and one or more circuits or components to provide communication with, or perform one or more memory operations on, the memory array 1202. The memory cells 1204 can be formed in vertical structures coupled to data lines formed using a metal line deposition process, where these data lines couple to or are a part of data lines 1210 coupled to sense amplifiers 1220. The memory device 1200 can be a memory die, for example, a NAND memory die. The memory device 1200 can include a row decoder 1212, a column decoder 1214, sub-block drivers 1209, the sense amplifiers 1220, a page buffer 1222, a selector 1224, an I/O circuit 1226, and a memory controller 1230.

The memory controller 1230 can include processing circuitry, including one or more processors 1205, and can be configured to perform operations of the memory device 1200 by executing instructions 1215. The memory controller 1230 can be coupled to registers 1231 that can contain parameter data for the memory controller 1230. For purposes of the present example, the instructions 1215 may be performed by memory within or dedicated to memory controller 1230. In other examples, at least some portion of the instructions executed by memory controller 1230 may be stored in other memory structures and loaded, for example, into local (memory controller) memory for execution by the memory controller 1230.

The memory cells 1204 of the memory array 1202 can be arranged in blocks, such as first and second blocks 1202A, 1202B. Each block can include sub-blocks. For example, the first block 1202A can include first and second sub-blocks $1202A_0$, $1202A_N$, and the second block 1202B can include first and second sub-blocks $1202B_0$, $1202B_N$. Each sub-block can include a number of physical pages, with each page including a number of memory cells 1204. Although illustrated herein as having two blocks, with each block having two sub-blocks, and each sub-block having a number of memory cells 1204, in other examples, the memory array 1202 can include more or fewer blocks, sub-blocks, memory cells, etc. In other examples, the memory cells 1204 can be arranged in a number of rows, columns, pages, sub-blocks, blocks, etc., and accessed using, for example, access lines 1206, data lines 1210, or one or more select gates, source lines, etc.

The memory controller 1230 can control memory operations of the memory device 1200 according to one or more signals or instructions received on control lines 1232, including, for example, one or more clock signals or control signals that indicate a desired operation (e.g., write, read, erase, etc.), or address signals (A0-AX) received on one or more address lines 1216. One or more devices external to the memory device 1200 can control the values of the control signals on the control lines 1232 or the address signals on the address line 1216. Examples of devices external to the memory device 1200 can include, but are not limited to, a host, an external memory controller, a processor, or one or more circuits or components not illustrated in FIG. 12.

The memory device 1200 can use access lines 1206 and data lines 1210 to transfer data to (e.g., write or erase) or from (e.g., read) one or more of the memory cells 1204. The row decoder 1212 and the column decoder 1214 can receive and decode the address signals (A0-AX) from the address line 1216, can determine which of the memory cells 1204 are to be accessed, and can provide signals to one or more of the access lines 1206 (e.g., one or more of a plurality of access lines ($WL_0$-$WL_M$)) or the data lines 1210 (e.g., one or more of a plurality of data lines (BL0-BLN)), such as described above.

The memory device 1200 can include sense circuitry, such as the sense amplifiers 1220, configured to determine the values of data on (e.g., read), or to determine the values of data to be written to, the memory cells 1204 using the data lines 1210. For example, in a selected string of memory cells 1204, one or more of the sense amplifiers 1220 can read a logic level in the selected memory cell 1204 in response to a read current flowing in the memory array 1202 through the selected string associated with the data lines 1210.

One or more devices external to the memory device 1200 can communicate with the memory device 1200 using the I/O lines (DQ0-DQN) 1208, address lines 1216 (A0-AX), or control lines 1232. The I/O circuit 1226 can transfer values of data in or out of the memory device 1200, such as in or out of the page buffer 1222 or the memory array 1202, using the I/O lines 1208, according to, for example, the control lines 1232 and address lines 1216. The page buffer 1222 can store data received from the one or more devices external to the memory device 1200 before the data is programmed into relevant portions of the memory array 1202, or can store data read from the memory array 1202 before the data is transmitted to the one or more devices external to the memory device 1200.

The column decoder 1214 can receive and decode address signals (A0-AX) into one or more column select signals ($CSEL_1$-$CSEL_N$). The selector 1224 (e.g., a select circuit) can receive the column select signals ($CSEL_1$-$CSEL_N$) and select data in the page buffer 1222 representing values of data to be read from or to be programmed into memory cells 1204. Selected data can be transferred between the page buffer 1222 and the I/O circuit 1226 using second data lines 1218.

The memory controller 1230 can receive positive and negative supply signals, such as a supply voltage (Vcc) 1234 and a negative supply (Vss) 1236 (e.g., a ground potential) with respect to Vcc, from an external source or supply (e.g., an internal or external battery, an AC-to-DC converter, etc.). In certain examples, the memory controller 1230 can include a regulator 1228 to internally provide positive or negative supply signals.

To program or write data to a memory cell, a programming voltage (VPGM) (e.g., one or more programming pulses, etc.) can be applied to selected access lines (e.g., $WL_i$), and, thus, to a control gate of each memory cell coupled to the selected access lines. Programming pulses can begin, for example, at or near 15V, and, in certain examples, can increase in magnitude during each programming pulse application. While the program voltage is applied to the selected access lines, a potential, such as a ground potential (e.g., Vss), can be applied to the data lines and substrates (and thus the channel structures between the sources and drains) of the memory cells targeted for programming, resulting in a charge transfer (e.g., direct injection or Fowler-Nordheim (FN) tunneling, etc.) from the channel structures to the floating gates of the targeted memory cells.

A Vpass can be applied to one or more access lines having memory cells that are not targeted for programming, or an inhibit voltage (e.g., Vcc) can be applied to data lines having memory cells that are not targeted for programming, for example, to inhibit charge from being transferred from the channel structures to the floating gates of such non-targeted memory cells. The pass voltage can be variable, depending, for example, on the proximity of the applied pass voltages to an access line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific access line, such as WL4, a pass voltage of 10V can be applied to one or more other access lines, such as WL3, WL5, etc., to inhibit programming of non-targeted memory cells, or to retain the values stored on such memory cells not targeted for programming. As the distance between an applied program voltage and the non-targeted memory cells increases, the pass voltage to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of access lines, etc., can be higher or lower, or more or less.

Between applications of one or more programming pulses (e.g., VPGM), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically VPGM) can be applied to the substrates (and thus the channel structures, between the sources and drains) of the memory cells targeted for erasure (e.g., using one or more data lines, select gates, etc.), while the access lines of the targeted memory cells are kept at a potential, such as a ground potential (e.g., Vss), resulting in a charge transfer (e.g., direct injection or FN tunneling, etc.) from the floating gates of the targeted memory cells to the channel structures.

When a host, which is a user device, sends an address to the memory device 1200, it typically can have an identification of a block, a page, and a column. The identification of the block is used to select the block of interest in the operation. The identification of the page is used to select the WL on which the page resides, and it also is used to select one particular sub-block, as the WL is shared among the sub-blocks of the block. The sub-block on which the page resides is decoded and that sub-block is selected. The address provided by the user device is used to turn on and off the selector device and access memory cells. In typical operations, one sub-block only is selected such that SGDs of one sub-block are active.

Based on the address provided by the user device, the memory controller 1230 can select any one sub-block or all sub-blocks. The memory controller 1230 can generate the sub-block address to the sub-block drivers 1209 and select any one sub-block or all sub-blocks. The memory controller 1230 can send the WL information to the row decoder 1212 and a column address to the column decoder 1214.

The sub-block drivers 1209 can include a number of independent drivers that generate signals to select lines 1213 $SL_{0-0}$ ... $SL_{K-J}$. These select lines can be coupled to different SGD transistors and different SGS transistors in different blocks. Multiple input signals can be assigned to each individual driver, depending on the different voltages designed for operation of the respective driver during erase operations, program operations, and read operations. From the sub-block drivers 1209, appropriate operational signals can be sent to the memory array 1202 via the select lines 1213 ($SL_{(sub-block\ \#)-(SGD\ \#\ or\ SGS\ \#)}$) $SL_{0-0}$ ... $SL_{K-J}$.

Figure 13:
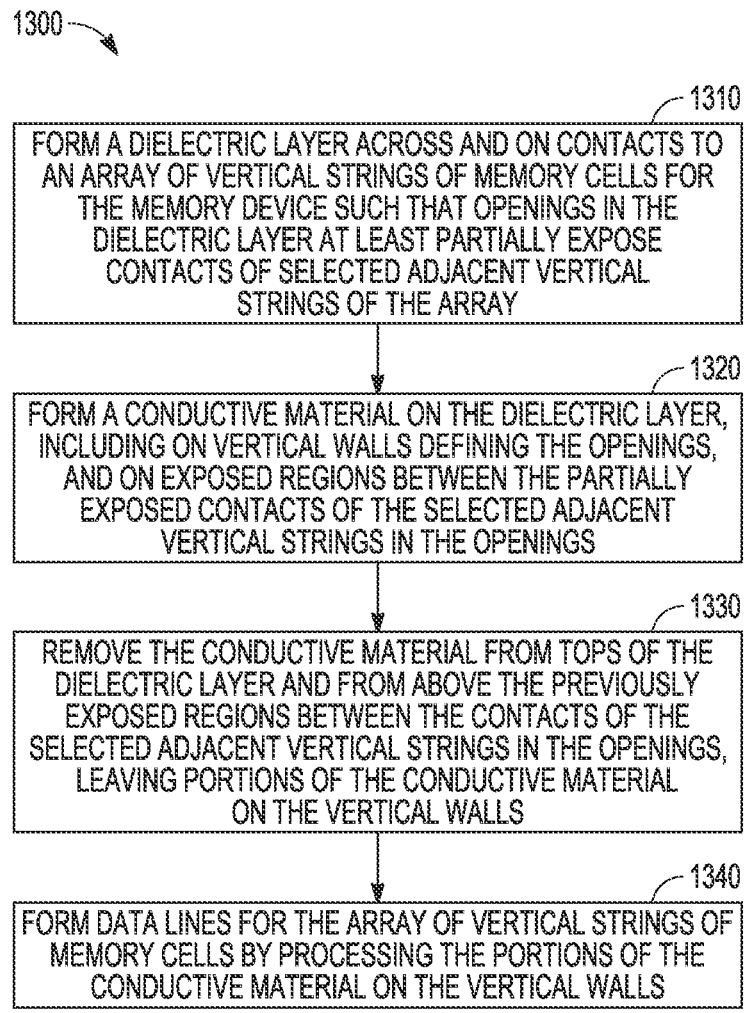
FIG. 13 is a flow diagram of features of an example method of forming a memory device, according to various embodiments.

FIG. 13 is a flow diagram of features of an embodiment of an example method 1300 of forming a memory device. At 1310, a dielectric layer is formed across and on contacts to an array of vertical strings of memory cells for the memory device such that openings in the dielectric layer at least partially expose contacts of selected adjacent vertical strings of the array. The selection can be on a pair-wise basis with no vertical string and associated contact belonging to more than one pair in a direction perpendicular to a direction for which data lines are to run. In this manner, each opening can expose, at least partially, two contacts, in a given direction, separated from each other by electrically insulating material. The formation of the dielectric layer can use appropriate deposition processes for the materials used. Appropriate techniques to form the dielectric layer can include, for example, CVD, ALD, variations of CVD and ALD, or other techniques. The dielectric layer can include, but is not limited to, an oxide such as silicon oxide. Forming the openings in the dielectric layer can be performed by using a pattern to remove the dielectric layer completely from above regions between contacts of the selected adjacent vertical strings. At 1320, a conductive material is formed on the dielectric layer, including on vertical walls defining the openings, and on exposed regions between the partially exposed contacts of the selected adjacent vertical strings in the openings. The conductive material can be selected to meet one or more criteria to function as data lines to the memory array of memory cells. The conductive material can include, but is not limited to, tungsten, ruthenium, titanium, titanium nitride, other metals, or a permutation of combinations of metals. Though low resistance metals may be appropriate for data lines, there may be embodiments in which the conductive material can include, but is not limited to, highly doped semiconductor material.

At 1330, the conductive material is removed from the tops of the dielectric layer and from above the previously exposed regions between the contacts of the selected adjacent vertical strings in the openings. This removal is performed leaving portions of the conductive material on the vertical walls. Removing the conductive material can include selectively etching the conductive material, leaving portions of the conductive material on the vertical walls.

At 1340, data lines are formed for the array of vertical strings of memory cells by processing the portions of the conductive material on the vertical walls. For example, material can be formed around the conductive material to provide electrical isolation for each data line. Forming data lines for the array of vertical strings of memory cells can include filling the openings with an isolation dielectric between the portions of the conductive material on the vertical walls of the openings and, after filling the openings, applying a chemical mechanical planarization to the portions of the conductive material and the filled openings.

Variations of the method 1300 or methods similar to the method 1300 can include a number of different embodiments that may be combined depending on the application of such methods, the architecture of the memory devices being formed, and/or the architecture of the memory system in which such memory devices are implemented. Such variations can include forming the conductive material by atomic layer deposition. Such variations can include forming the conductive material by forming a metal liner. The thickness of the metal liner can be controlled to form the data lines with an associated range of capacitance. The metal liner can include ruthenium. Other metals such as, but not limited to, tungsten can be used.

Variations of the method 1300 or methods similar to the method 1300 can include forming the data lines with a selected height by controlling thickness of the dielectric layer when forming the dielectric layer across and on the contacts to the array of vertical strings of memory cells for the memory device. Variations in forming the data lines can include forming the conductive material in loops in a pair-wise basis and removing loop ends.

Figure 14:
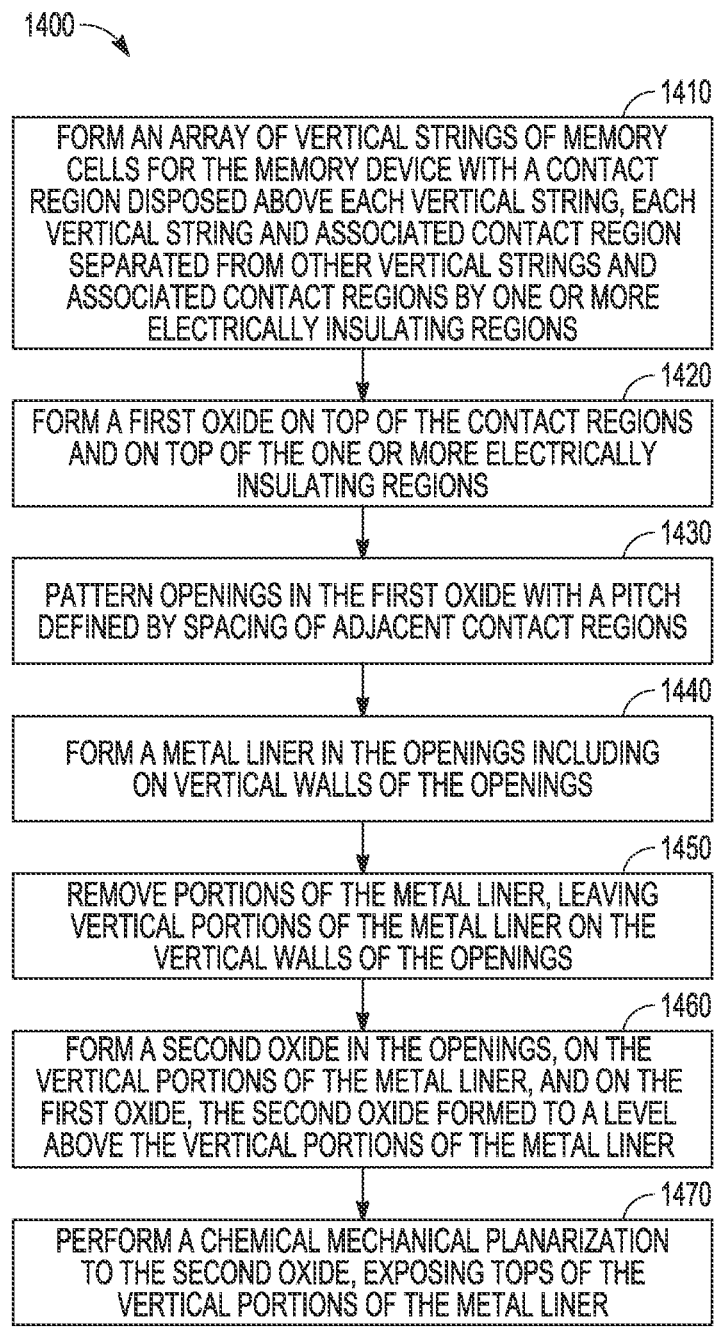
FIG. 14 is another flow diagram of features of an example method of forming a memory device, according to various embodiments.

FIG. 14 is a flow diagram of features of an embodiment of an example method 1400 of forming a memory device. At 1410, an array of vertical strings of memory cells for the memory device is formed with a contact region disposed above each vertical string. Each vertical string and associated contact region is separated from other vertical strings and associated contact regions by one or more electrically insulating regions. The array can be formed extending above a substrate. The substrate can be, but is not limited to, a semiconductor substrate. The semiconductor substrate can be, but is not limited to, a silicon-based substrate, a silicon-on-insulator substrate, a non-silicon semiconductor substrate, or a combination thereof. The selection of a substrate can depend on the technology used to form the memory device on a die. Various architectures can be used for the memory device. For example, with the array of memory cells extending above a substrate, support circuitry for the array can be disposed in the substrate at a level below the array.

At 1420, a first oxide is formed on the top of the contact regions and on top of the one or more electrically insulating regions. The material for the first oxide can be selected based on the function of the first oxide in forming one or more components in the construction of the memory device and on the function of the first oxide in the final memory device structure. The first oxide can include, but is not limited to, silicon oxide. At 1430, openings in the first oxide are patterned with a pitch defined by spacing of adjacent contact regions. For the method 1400 directed to forming a memory device in which the data lines to the memory array of the memory device are to have a specific pitch or a pitch less than a threshold pitch, the pattern can be selected such that, on completion of forming the memory device, the data lines match the specified pitch or a pitch less than the threshold pitch. For example, the pattern can be provided to result in a pitch of the data lines being 19 nm or less. The pitch can be defined for a data line pitch of less than twenty nanometers.

At 1440, a metal liner is formed in the openings including on vertical walls of the openings. The metal liner is formed in the openings, where each opening formed along a direction in which data lines are to run in the memory device. The metal liner formed in the openings can include metal selected to meet one or more criteria to function as data lines to the memory array of memory cells. The metal or metals selected for the metal liner can be selected such that thickness of the metal liner can be controlled in forming the metal liner to meet resistance and capacitance criteria. The metal liner can include, but is not limited to, tungsten, ruthenium, titanium, titanium nitride, other metals, or a combination of metals.

At 1450, portions of the metal liner are removed, leaving vertical portions of the metal liner on the vertical walls of the openings. These remaining vertical portions formed in the openings are to be used in forming the data lines for the memory array of the memory device. At 1460, a second oxide is formed in the openings, on the vertical portions of the metal liner, and on the first oxide. The second oxide is formed to a level above the vertical portions of the metal liner. This second oxide provides electrically insulating material between the vertical portions of the metal liner that form the data lines. At 1470, a CMP is performed to the second oxide. The result of the CMP is the exposing of tops of the vertical portions of the metal liner. In addition, the CMP can be used to adjust the height of the data lines to a desired height.

Variations of the method 1400 or methods similar to the method 1400 can include a number of different embodiments that may be combined depending on the application of such methods, the architecture of the memory devices being formed, and/or the architecture of the memory system in which such memory devices are implemented. Such variations can include forming routing lines for the data lines with the routing lines having a pitch greater than the pitch of the data lines. A single mask can be used for forming the data lines and the routing lines. The mask can include a first portion having pattern for the data lines and a second portion having a pattern for forming the routing lines.

Figure 15:
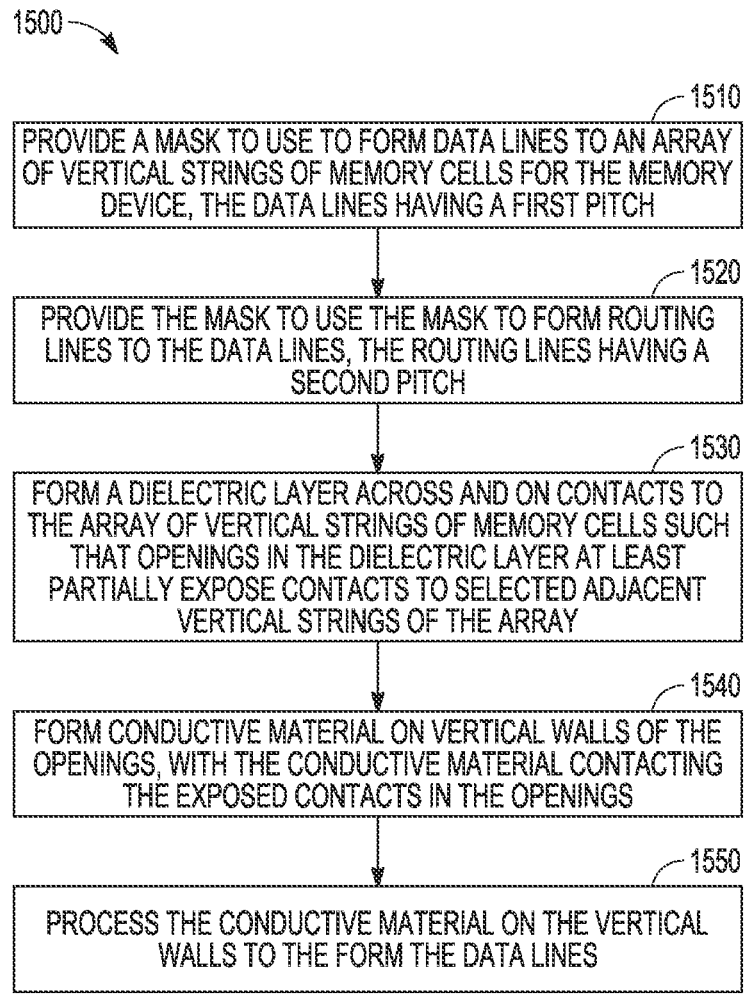
FIG. 15 is another flow diagram of features of an example method of forming a memory device, according to various embodiments.

FIG. 15 is a flow diagram of features of an embodiment of an example method 1500 of forming a memory device. At 1510, a mask is provided to form data lines to an array of vertical strings of memory cells for the memory device, with the data lines having a first pitch. At 1520, the mask is provided to use the mask to form routing lines to the data lines, with the routing lines having a second pitch. The second pitch can be greater than the first pitch. With differences in pitch for the area of the memory die associated with the data lines and the area of the memory die associated with the routing lines, the mask can include different patterns for the two areas.

At 1530, with formation of the data lines using the mask, a dielectric layer is formed across and on contacts to the array of vertical strings of memory cells such that openings in the dielectric layer at least partially expose contacts to selected adjacent vertical strings of the array. At 1540, conductive material is formed on vertical walls of the openings, with the conductive material contacting the exposed contacts in the openings. At 1550, the conductive material on the vertical walls is processed to the form the data lines.

Variations of the method 1500 or methods similar to the method 1500 can include a number of different embodiments that may be combined depending on the application of such methods, the architecture of the memory devices being formed, and/or the architecture of the memory system in which such memory devices are implemented. Such variations can include forming the data lines with a selected height by controlling thickness of the dielectric layer when forming the dielectric layer across and on the contacts.

Variations of the method 1500 or methods similar to the method 1500 can include forming the conductive material by forming a metal liner. The data lines can be formed with an associated range of capacitance by controlling thickness of the metal liner. The data lines and the routing lines can be formed by forming the conductive material in loops on a pair-wise basis and removing loop ends.

In various embodiments, a memory device can be constructed using one or more permutations of the methods 1300, 1400, and 1500. These approaches provide for construction of data lines in a selectable manner to attain criteria with respect to capacitance between data lines and resistance of the data lines.

Figure 16:
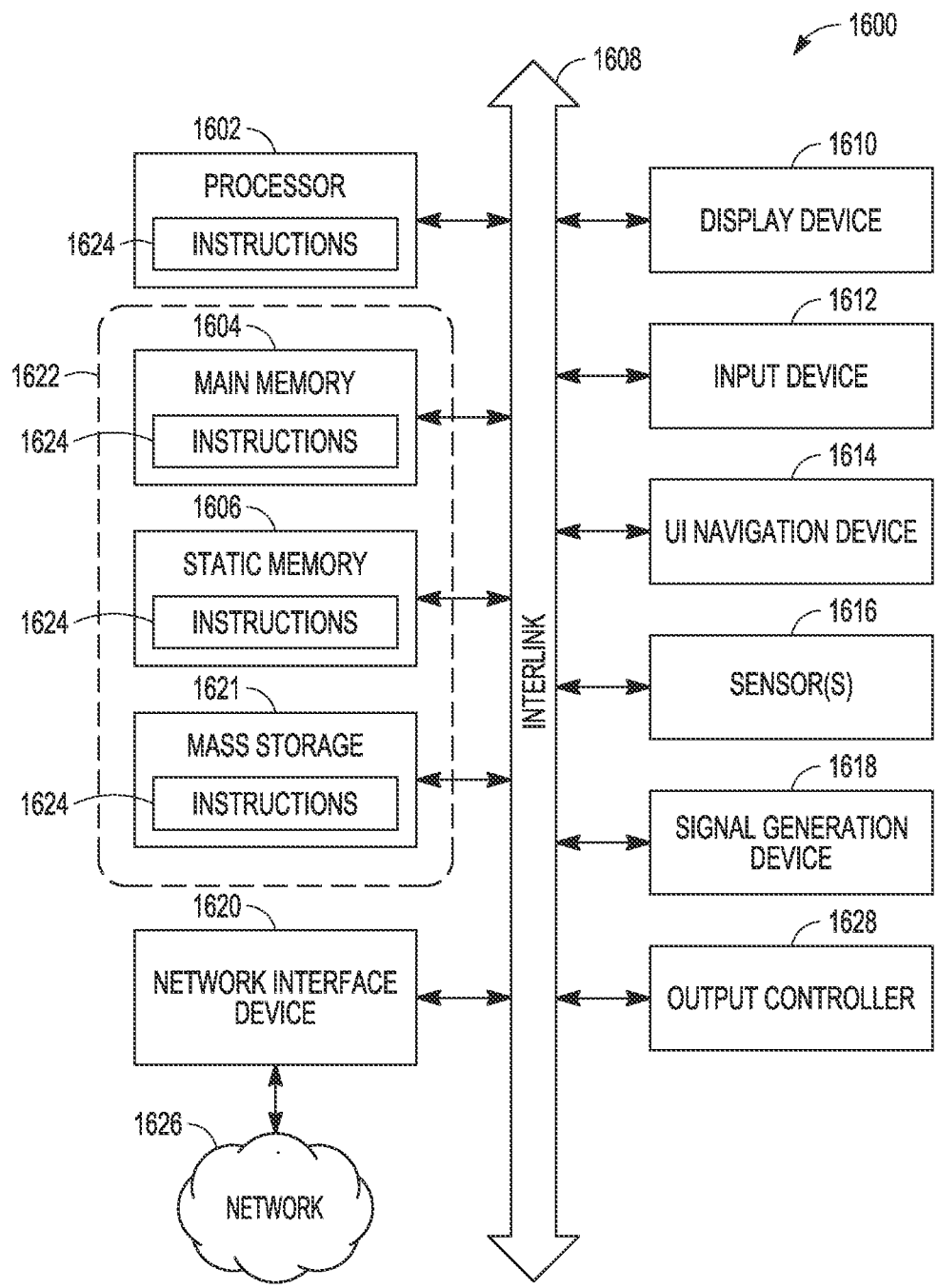
FIG. 16 is a block diagram illustrating an example of a machine upon which one or more embodiments may be implemented, according to various embodiments.

FIG. 16 illustrates a block diagram of an example machine 1600 upon which any one or more of the techniques (e.g., methodologies) discussed herein may perform. In alternative embodiments, the machine 1600 may operate as a standalone device or may be connected (e.g., networked) to other machines. In a networked deployment, the machine 1600 may operate in the capacity of a server machine, a client machine, or both in server-client network environments. In an example, the machine 1600 may act as a peer machine in peer-to-peer (P2P) (or other distributed) network environment. The machine 1600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. The example machine 1600 can be arranged to operate in the environment 100 of FIG. 1. The example machine 1600 can include one or more memory devices having structures as discussed with respect to the memory array 200 of FIG. 2, the memory array 300 of FIG. 3, and the memory device 1200 of FIG. 12.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1600 (e.g., the host device 105, the memory device 110, etc.) may include a hardware processor 1602 (e.g., a CPU, a GPU, a hardware processor core, or any combination thereof, such as the memory processing device 115, etc.), a main memory 1604 and a static memory 1606, some or all of which may communicate with each other via an interlink (e.g., bus) 1608. The machine 1600 may further include a display unit 1610, an alphanumeric input device 1612 (e.g., a keyboard), and a user interface (UI) navigation device 1614 (e.g., a mouse). In an example, the display unit 1610, input device 1612, and UI navigation device 1614 may be a touch screen display. The machine 1600 may additionally include a mass storage (e.g., drive unit) 1621, a signal generation device 1618 (e.g., a speaker), a network interface device 1620, and one or more sensors 1616, such as a global positioning system (GPS) sensor, compass, accelerometer, or other sensor. The machine 1600 may include an output controller 1628, such as a serial (e.g., USB, parallel, or other wired or wireless (e.g., infrared (IR), near field communication (NFC), etc.) connection to communicate or control one or more peripheral devices (e.g., a printer, card reader, etc.).

The machine 1600 may include a machine readable medium 1622 on which is stored one or more sets of data structures or instructions 1624 (e.g., software) embodying or utilized by any one or more of the techniques or functions described herein. The instructions 1624 may also reside, completely or at least partially, within the main memory 1604, within static memory 1606, or within the hardware processor 1602 during execution thereof by the machine 1600. In an example, one or any combination of the hardware processor 1602, the main memory 1604, the static memory 1606, or the mass storage 1621 may constitute the machine readable medium 1622. The instructions 1624 can include instructions for parity management.

While the machine readable medium 1622 is illustrated as a single medium, the term "machine readable medium" may include a single medium or multiple media (e.g., a centralized or distributed database, or associated caches and servers) configured to store the one or more instructions 1624.

The term "machine readable medium" may include any medium that is capable of storing, encoding, or carrying instructions for execution by the machine 1600 and that cause the machine 1600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 1624 (e.g., software, programs, an operating system (OS), etc.) or other data stored on the mass storage 1621, can be accessed by the memory 1604 for use by the processor 1602. The memory 1604 (e.g., DRAM) is typically fast, but volatile, and thus a different type of storage than the mass storage 1621 (e.g., an SSD), which is suitable for long-term storage, including while in an "off" condition. The instructions 1624 or data in use by a user or the machine 1600 are typically loaded in the memory 1604 for use by the processor 1602. When the memory 1604 is full, virtual space from the mass storage 1621 can be allocated to supplement the memory 1604; however, because the storage 1621 device is typically slower than the memory 1604, and write speeds are typically at least twice as slow as read speeds, use of virtual memory can greatly reduce user experience due to storage device latency (in contrast to the memory 1604, e.g., DRAM). Further, use of the mass storage 1621 for virtual memory can greatly reduce the usable lifespan of the mass storage 1621.

In contrast to virtual memory, virtual memory compression (e.g., the Linux® kernel feature "ZRAM") uses part of the memory as compressed block storage to avoid paging to the mass storage 1621. Paging takes place in the compressed block until it is necessary to write such data to the mass storage 1621. Virtual memory compression increases the usable size of memory 1604, while reducing wear on the mass storage 1621.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 1624 may further be transmitted or received over a communications network 1626 using a transmission medium via the network interface device 1620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1620 may include one or more physical jacks (e.g., Ethernet, coaxial, or phone jacks) or one or more antennas to connect to the communications network 1626. In an example, the network interface device 1620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of storing, encoding or carrying instructions for execution by the machine 1600, and includes digital or analog communications signals or other tangible medium to facilitate communication of such software.

The following are example embodiments of systems and methods, in accordance with the teachings herein.

An example method 1 of forming a memory device can comprise: forming a dielectric layer across and on contacts to an array of vertical strings of memory cells for the memory device such that openings in the dielectric layer at least partially expose contacts of selected adjacent vertical strings of the array; forming a conductive material on the dielectric layer, including on vertical walls defining the openings, and on exposed regions between the partially exposed contacts of the selected adjacent vertical strings in the openings; removing the conductive material from tops of the dielectric layer and from above the previously exposed regions between the contacts of the selected adjacent vertical strings in the openings, leaving portions of the conductive material on the vertical walls; and forming data lines for the array of vertical strings of memory cells by processing the portions of the conductive material on the vertical walls.

An example method 2 of forming a memory device can include features of example method 1 of forming a memory device and can include forming the openings in the dielectric layer by using a pattern to remove the dielectric layer completely from above regions between contacts of the selected adjacent vertical strings.

An example method 3 of forming a memory device can include features of any of the preceding example methods of forming a memory device and can include forming the data lines with a selected height by controlling thickness of the dielectric layer when forming the dielectric layer across and on the contacts to the array of vertical strings of memory cells for the memory device.

An example method 4 of forming a memory device can include features of any of the preceding example methods of forming a memory device and can include forming the conductive material by atomic layer deposition.

An example method 5 of forming a memory device can include features of any of the preceding example methods of forming a memory device and can include forming the conductive material on the dielectric layer and on the previously exposed regions between the contacts of adjacent vertical strings in the openings to include forming a metal liner.

An example method 6 of forming a memory device can include features of example method 5 of forming a memory device and any features of the example methods 1 to 4 of forming a memory device and can include forming the data lines with an associated range of capacitance by controlling thickness of the metal liner.

An example method 7 of forming a memory device can include features of example method 5 of forming a memory device and any features of example methods 1 to 4 and 6 of forming a memory device and can include the metal liner including ruthenium.

An example method 8 of forming a memory device can include features of any of the preceding example methods of forming a memory device and can include forming the data lines to include forming the conductive material in loops in a pair-wise basis and removing loop ends.

An example method 9 of forming a memory device can include features of any of the preceding example methods of forming a memory device and can include removing the conductive material to include selectively etching the conductive material, leaving portions of the conductive material on the vertical walls.

An example method 10 of forming a memory device can include features of any of the preceding example methods of forming a memory device and can include forming data lines for the array of vertical strings of memory cells to include: filling the openings with an isolation dielectric between the portions of the conductive material on the vertical walls of the openings; and after filling the openings, applying a chemical mechanical planarization to the portions of the conductive material and the filled openings.

In an example method 11 of forming a memory device, any of the example methods 1 to 10 of forming a memory device may be performed in forming an electronic memory apparatus further comprising a host processor and a communication bus extending between the host processor and the memory device.

In an example method 12 of forming a memory device, any of the example methods 1 to 11 of forming a memory device may be modified to include operations set forth in any other of example methods 1 to 11 of forming a memory device.

In an example method 13 of forming a memory device, any of the example methods 1 to 12 of forming a memory device may be implemented at least in part through use of instructions stored as a physical state in one or more machine-readable storage devices.

An example method 14 of forming a memory device can include features of any of the preceding example methods 1 to 13 of forming a memory device and can include performing functions associated with any features of example memory devices and systems having memory devices discussed herein.

An example machine-readable storage device 1 storing instructions, which, when executed by one or more processors, cause a machine to perform operations, can comprise instructions to perform functions associated with any features of example memory devices and systems having memory devices discussed herein or perform methods associated with any features of example methods 1 to 14.

An example method 15 of forming a memory device can comprise: forming an array of vertical strings of memory cells for the memory device with a contact region disposed above each vertical string, each vertical string and associated contact region separated from other vertical strings and associated contact regions by one or more electrically insulating regions; forming a first oxide on top of the contact regions and on top of the one or more electrically insulating regions; patterning openings in the first oxide with a pitch defined by spacing of adjacent contact regions; forming a metal liner in the openings including on vertical walls of the openings; removing portions of the metal liner, leaving vertical portions of the metal liner on the vertical walls of the openings; forming a second oxide in the openings, on the vertical portions of the metal liner, and on the first oxide, with the second oxide formed to a level above the vertical portions of the metal liner; and performing a chemical mechanical planarization to the second oxide, exposing tops of the vertical portions of the metal liner.

An example method 16 of forming a memory device can include features of example method 15 of forming a memory device and can include using a selected metal for the metal liner and controlling thickness in forming the metal liner to meet resistance and capacitance criteria.

An example method 17 of forming a memory device can include features of any of the example methods 15 or 16 of forming a memory device and can include forming routing lines for the data lines with the routing lines having a pitch greater than the pitch of the data lines, using a single mask for forming the data lines and the routing lines.

An example method 18 of forming a memory device can include features of any of the example methods 15 to 17 of forming a memory device and can include the pitch being defined for a data line pitch of less than twenty nanometers.

In an example method 19 of forming a memory device, any of the example methods 15 to 18 of forming a memory device may be performed in forming an electronic memory apparatus further comprising a host processor and a communication bus extending between the host processor and the memory device.

In an example method 20 of forming a memory device, any of the example methods 15 to 19 of forming a memory device may be modified to include operations set forth in any other of example methods 1 to 19 of forming a memory device.

In an example method 21 of forming a memory device, any of the example methods 15 to 20 of forming a memory device may be implemented at least in part through use of instructions stored as a physical state in one or more machine-readable storage devices.

An example method 22 of forming a memory device can include features of any of the preceding example methods 1 to 21 of forming a memory device and can include performing functions associated with any features of example memory devices and systems having memory devices discussed herein.

An example machine-readable storage device 2 storing instructions, which, when executed by one or more processors, cause a machine to perform operations, can comprise instructions to perform functions associated with any features of example memory devices and systems having memory devices discussed herein or perform methods associated with any features of example methods 15 to 22.

An example method 23 of forming a memory device can comprise: forming, using a mask, data lines to an array of vertical strings of memory cells for the memory device, the data lines having a first pitch; forming, using the mask, routing lines to the data lines, the routing lines having a second pitch, with formation of the data lines including: forming a dielectric layer across and on contacts to the array of vertical strings of memory cells such that openings in the dielectric layer at least partially expose contacts to selected adjacent vertical strings of the array; forming conductive material on vertical walls of the openings, with the conductive material contacting the exposed contacts in the openings; and processing the conductive material on the vertical walls to the form the data lines.

An example method 24 of forming a memory device can include features of example method 23 of forming a memory device and can include the second pitch being greater than the first pitch.

An example method 25 of forming a memory device can include features of any of the example methods 23 or 24 of forming a memory device and can include forming the data lines with a selected height by controlling thickness of the dielectric layer when forming the dielectric layer across and on the contacts.

An example method 26 of forming a memory device can include features of any of the example methods 23 to 25 of forming a memory device and can include forming the conductive material to include forming a metal liner.

An example method 27 of forming a memory device can include features of example method 26 of forming a memory device and any features of the preceding example methods 23 to 25 of forming a memory device and can include forming the data lines with an associated range of capacitance by controlling thickness of the metal liner.

An example method 28 of forming a memory device can include features of any of the example methods 23 to 27 of forming a memory device and can include forming the data lines and the routing lines to include forming the conductive material in loops on a pair-wise basis and removing loop ends.

In an example method 29 of forming a memory device, any of the example methods 23 to 28 of forming a memory device may be performed in forming an electronic memory apparatus further comprising a host processor and a communication bus extending between the host processor and the memory device.

In an example method 30 of forming a memory device, any of the example methods 23 to 29 of forming a memory device may be modified to include operations set forth in any other of example methods 1 to 29 of forming a memory device.

In an example method 31 of forming a memory device, any of the example methods 23 to 30 of forming a memory device may be implemented at least in part through use of instructions stored as a physical state in one or more machine-readable storage devices.

An example method 32 of forming a memory device can include features of any of the preceding example methods 1 to 31 of forming a memory device and can include performing functions associated with any features of example memory devices and systems having memory devices discussed herein.

An example machine-readable storage device 3 storing instructions, which, when executed by one or more processors, cause a machine to perform operations, can comprise instructions to perform functions associated with any features of example memory devices and systems having memory devices discussed herein or perform methods associated with any features of example methods 23 to 32.

In various examples, the components, controllers, processors, units, engines, or tables described herein can include, among other things, physical circuitry or firmware stored on a physical device. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, RAMs. ROMs, solid state drives SSDs, UFS devices, embedded eMMC devices, and the like.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method of forming a memory device, the method comprising:
   forming a dielectric layer across and on contacts to an array of vertical strings of memory cells for the memory device such that openings in the dielectric layer at least partially expose contacts of selected adjacent vertical strings of the array;
   forming a conductive material on the dielectric layer, including on vertical walls defining the openings, and on exposed regions between the partially exposed contacts of the selected adjacent vertical strings in the openings;

removing the conductive material from tops of the dielectric layer and from above the previously exposed regions between the contacts of the selected adjacent vertical strings in the openings, leaving portions of the conductive material on the vertical walls; and forming data lines for the array of vertical strings of memory cells by processing the portions of the conductive material on the vertical walls.

2. The method of claim 1, wherein the method includes forming the openings in the dielectric layer by using a pattern to remove the dielectric layer completely from above regions between contacts of the selected adjacent vertical strings.

3. The method of claim 1, wherein the method includes forming the data lines with a selected height by controlling thickness of the dielectric layer when forming the dielectric layer across and on the contacts to the array of vertical strings of memory cells for the memory device.

4. The method of claim 1, wherein forming the conductive material includes forming the conductive material by atomic layer deposition.

5. The method of claim 1, wherein forming the conductive material on the dielectric layer and on the previously exposed regions between the contacts of adjacent vertical strings in the openings includes forming a metal liner.

6. The method of claim 5, wherein the method includes forming the data lines with an associated range of capacitance by controlling thickness of the metal liner.

7. The method of claim 5, wherein the metal liner includes ruthenium.

8. The method of claim 1, wherein forming the data lines includes forming the conductive material in loops in a pair-wise basis and removing loop ends.

9. The method of claim 1, wherein removing the conductive material includes selectively etching the conductive material, leaving portions of the conductive material on the vertical walls.

10. The method of claim 1, wherein forming data lines for the array of vertical strings of memory cells includes:
   filling the openings with an isolation dielectric between the portions of the conductive material on the vertical walls of the openings; and
   after filling the openings, applying a chemical mechanical planarization to the portions of the conductive material and the filled openings.

11. A method of forming a memory device, the method comprising:
   forming an array of vertical strings of memory cells for the memory device with a contact region disposed above each vertical string, each vertical string and associated contact region separated from other vertical strings and associated contact regions by one or more electrically insulating regions;
   forming a first oxide on top of the contact regions and on top of the one or more electrically insulating regions;
   patterning openings in the first oxide with a pitch defined by spacing of adjacent contact regions;
   forming a metal liner in the openings including on vertical walls of the openings;
   removing portions of the metal liner, leaving vertical portions of the metal liner on the vertical walls of the openings;
   forming a second oxide in the openings, on the vertical portions of the metal liner, and on the first oxide, with the second oxide formed to a level above the vertical portions of the metal liner; and
   performing a chemical mechanical planarization to the second oxide, exposing tops of the vertical portions of the metal liner.

12. The method of claim 11, wherein the method includes using a selected metal for the metal liner and controlling thickness in forming the metal liner to meet resistance and capacitance criteria.

13. The method of claim 11, wherein the method includes forming routing lines for the data lines with the routing lines having a pitch greater than the pitch of the data lines, using a single mask for forming the data lines and the routing lines.

14. The method of claim 11, wherein the pitch is defined for a data line pitch of less than twenty nanometers.

15. A method of forming a memory device, the method comprising:
   forming, using a mask, data lines to an array of vertical strings of memory cells for the memory device, the data lines having a first pitch;
   forming, using the mask, routing lines to the data lines, the routing lines having a second pitch, with formation of the data lines including:
      forming a dielectric layer across and on contacts to the array of vertical strings of memory cells such that openings in the dielectric layer at least partially expose contacts to selected adjacent vertical strings of the array;
      forming conductive material on vertical walls of the openings, with the conductive material contacting the exposed contacts in the openings; and
      processing the conductive material on the vertical walls to the form the data lines.

16. The method of claim 15, wherein the second pitch is greater than the first pitch.

17. The method of claim 15, wherein the method includes forming the data lines with a selected height by controlling thickness of the dielectric layer when forming the dielectric layer across and on the contacts.

18. The method of claim 15, wherein forming the conductive material includes forming a metal liner.

19. The method of claim 18, wherein the method includes forming the data lines with an associated range of capacitance by controlling thickness of the metal liner.

20. The method of claim 15, wherein forming the data lines and the routing lines includes forming the conductive material in loops on a pair-wise basis and removing loop ends.

* * * * *